(12) United States Patent
Simsek-Ege

(10) Patent No.: US 12,431,464 B2
(45) Date of Patent: Sep. 30, 2025

(54) MICROELECTRONIC DEVICES, RELATED ELECTRONIC SYSTEMS, AND METHODS OF FORMING MICROELECTRONIC DEVICES

(71) Applicant: Micron Technology, Inc., Boise, ID (US)

(72) Inventor: Fatma Arzum Simsek-Ege, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 501 days.

(21) Appl. No.: 17/804,251

(22) Filed: May 26, 2022

(65) Prior Publication Data

US 2023/0387072 A1    Nov. 30, 2023

(51) Int. Cl.
| | |
|---|---|
| *H01L 25/065* | (2023.01) |
| *G11C 11/408* | (2006.01) |
| *H10B 12/00* | (2023.01) |
| *H10B 41/23* | (2023.01) |
| *H10B 43/27* | (2023.01) |

(52) U.S. Cl.
CPC ...... *H01L 25/0652* (2013.01); *G11C 11/4087* (2013.01); *H10B 12/315* (2023.02); *H10B 41/23* (2023.02); *H10B 43/27* (2023.02)

(58) Field of Classification Search
CPC . H01L 25/0652; H01L 25/18; G11C 11/4087; H10B 12/315; H10B 41/23; H10B 43/27; H10B 12/05; H10B 12/50; H10D 84/811; H10D 88/00
See application file for complete search history.

(56) References Cited

U.S. PATENT DOCUMENTS

| | | | |
|---|---|---|---|
| 2015/0161072 A1* | 6/2015 | Gillingham | G11C 7/1072 711/167 |
| 2018/0323199 A1* | 11/2018 | Roberts | H10D 64/518 |
| 2022/0115292 A1* | 4/2022 | Choi | H10N 19/101 |
| 2022/0375851 A1* | 11/2022 | Choi | H10D 1/68 |

\* cited by examiner

*Primary Examiner* — Steven B Gauthier
*Assistant Examiner* — Alvin L Lee
(74) *Attorney, Agent, or Firm* — TraskBritt

(57) ABSTRACT

A microelectronic device includes a first microelectronic device structure including a memory array region comprising memory cells and a second microelectronic device structure vertically overlying the first microelectronic device structure. The second microelectronic device structure includes control logic devices configured to effectuate at least a portion of control operations for the memory cells and first multi-capacitor structures within spaces between the control logic devices and horizontally neighboring at least one of the control logic devices. The first multi-capacitor structures span a same or fewer number of routing tiers as the control logic devices and are configured to regulate and supply voltage to one or more of the control logic devices.

9 Claims, 14 Drawing Sheets

MICROELECTRONIC DEVICES, RELATED ELECTRONIC SYSTEMS, AND METHODS OF FORMING MICROELECTRONIC DEVICES

TECHNICAL FIELD

The disclosure, in various embodiments, relates generally to the field of microelectronic device design and fabrication. More specifically, the disclosure relates to methods of forming microelectronic devices from independently formed microelectronic device structures, and to related microelectronic devices and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified designs.

One example of a microelectronic device is a memory device. Memory devices are generally provided as internal integrated circuits in computers or other electronic devices. There are many types of memory devices including, but not limited to, volatile memory devices, such as dynamic random-access memory (DRAM) devices; and non-volatile memory devices such as NAND Flash memory devices. A typical memory cell of a DRAM device includes one access device, such as a transistor, and one memory storage structure, such as a capacitor. Modern applications for semiconductor devices can employ significant quantities of memory cells, arranged in memory arrays exhibiting rows and columns of the memory cells. The memory cells may be electrically accessed through digit lines (e.g., bit lines, data lines) and word lines (e.g., access lines) arranged along the rows and columns of the memory cells of the memory arrays. Memory arrays can be two-dimensional (2D) so as to exhibit a single deck (e.g., a single tier, a single level) of the memory cells, or can be three-dimensional (3D) so as to exhibit multiple decks (e.g., multiple levels, multiple tiers) of the memory cells.

Control logic devices within a base control logic structure underlying a memory array of a memory device have been used to control operations (e.g., access operations, read operations, write operations) of the memory cells of the memory device. An assembly of the control logic devices may be provided in electrical communication with the memory cells of the memory array by way of routing and interconnect structures. However, processing conditions (e.g., temperatures, pressures, materials) for the formation of the memory array over the base control logic structure can limit the configurations and performance of the control logic devices within the base control logic structure. In addition, the quantities, dimensions, and arrangements of the different control logic devices employed within the base control logic structure can also undesirably impede reductions to the size (e.g., horizontal footprint) of the memory device, and/or improvements in the performance (e.g., faster memory cell ON/OFF speed, lower threshold switching voltage requirements, faster data transfer rates, lower power consumption) of the memory device. Furthermore, as the density and complexity of the memory array have increased, so has the complexity of the control logic devices. In some instances, the control logic devices consume more real estate than the memory devices, reducing the memory density of the memory device. Moreover, capacitors for regulating and supplying voltages to the control logic devices can require substantial footprints.

DETAILED DESCRIPTION

Figure 1A:
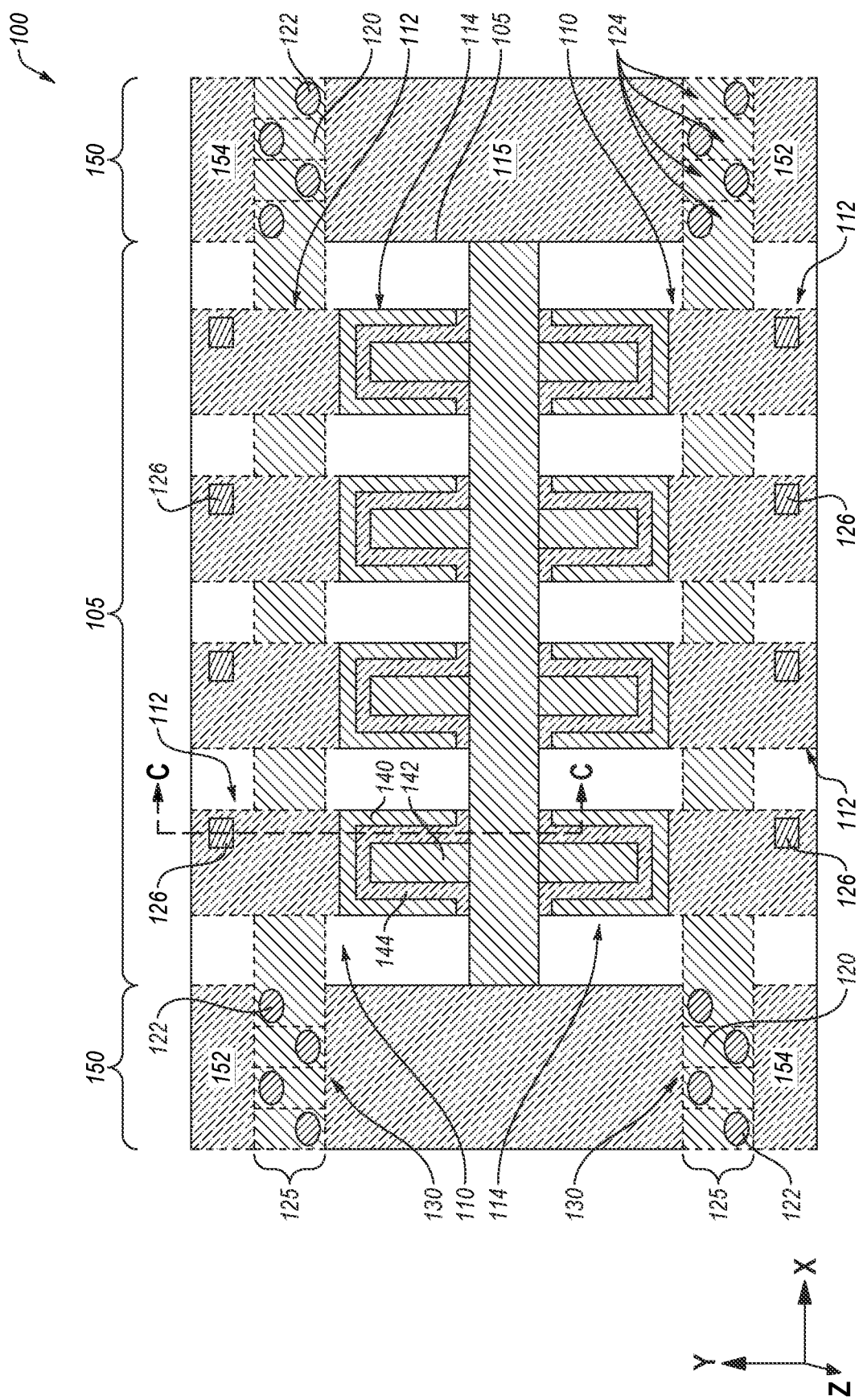
FIG. 1A shows a simplified top-down view of a first microelectronic device structure, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device), apparatus, or electronic system, or a complete microelectronic device, apparatus, or electronic system. The structures described below do not form a complete microelectronic device, apparatus, or electronic system. Only those process acts and structures necessary to understand the embodiments described herein are described in detail below. Additional acts to form a complete microelectronic device, apparatus, or electronic system from the structures may be performed by conventional techniques.

The materials described herein may be formed by conventional techniques including, but not limited to, spin coating, blanket coating, chemical vapor deposition (CVD), atomic layer deposition (ALD), plasma-enhanced ALD, physical vapor deposition (PVD), plasma-enhanced chemical vapor deposition (PECVD), or low-pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional DRAM; conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively doped polysilicon, conductively doped germanium (Ge), conductively doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

As used herein, "semiconductor material" and "semiconductive material" refers to a material having an electrical conductivity between those of insulative materials and conductive materials. For example, a semiconductor material may have an electrical conductivity of between about $10^{-8}$ Siemens per centimeter (S/cm) and about $10^4$ S/cm ($10^6$ S/m) at room temperature. Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_XGa_{1-X}As$), and quaternary compound semiconductor materials (e.g., $Ga_XIn_{1-X}As_YP_{1-Y}$), without limitation. Compound semiconductor materials may include combinations of elements from columns III and V of the periodic table of elements (III-V semiconductor materials) or from columns II and VI of the periodic table of elements (II-VI semiconductor materials), without limitation. Further examples of semiconductor materials include oxide semiconductor materials such as zinc tin oxide (ZnxSnyO, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials.

Embodiments include a microelectronic device including a first microelectronic device structure having a memory array and a second microelectronic device structure including conductive metal-oxide-semiconductor (CMOS) devices over the first microelectronic device structure. The second microelectronic device structure further includes structures having multiple metal-insulator-metal (MIM) capacitors between control logic devices (e.g., pumps) within the second microelectronic device structure. The microelectronic device further includes a third microelectronic device structure adjacent the second microelectronic device structure and opposite the first microelectronic device structure and having multiple additional metal-insulator-metal (MIM) capacitors. The MIM capacitors of the second and third microelectronic device structure supply and regulate power to the memory array through and by way of some of the control logic devices (e.g., pumps) within the second microelectronic device structure. As a result, respective capacitors of the memory array are utilized for array efficiency and MBITS.

FIGS. 1A-1D include a simplified a partial top-down view (FIG. 1A), a simplified cross-sectional view (FIG. 1B), and enlarged and simplified partial cross-sectional views (FIGS. 1C and 1D) illustrating embodiments of a first microelectronic device structure 100 (e.g., a memory device, such as a 3D DRAM memory device), in accordance with embodiments of the disclosure. With the description provided below, it will be readily apparent to one of ordinary skill in the art that the methods and structures described herein with reference to FIGS. 1A-1D may be used in various devices and electronic systems. The first microelectronic device structure 100 may also be referred to herein as a die or a wafer.

Referring to FIG. 1A, the first microelectronic device structure 100 includes an array region 105 and one or more peripheral regions 150 located external to the array region 105. In some embodiments, the peripheral regions 150 laterally (e.g., in at least X-direction) surround the array region 105. In some embodiments, the peripheral regions 150 substantially surround all horizontal boundaries (e.g., an entire horizontal area) of the array region 105.

The array region 105 may include vertical (e.g., in the Z-direction; into and out of the page in the view of FIG. 1A) stacks of memory cells 110, each vertical stack of memory cells 110 comprising a vertical stack of access devices 112 (illustrated in broken lines in FIG. 1C) and a vertical stack of storage devices 114, which are more fully described with reference to FIGS. 1C and 1D. Although FIG. 1A illustrates eight (8) vertical stacks of memory cells 110, the disclosure is not so limited and the array region 105 may include greater than eight vertical stacks of memory cells 110.

The access devices 112 may each individually be operably coupled to a first conductive structure 120 of a stack structure 125 comprising levels of the conductive structures 120 (also referred to herein as "first conductive lines" or "word lines") vertically (e.g., in the Z-direction) spaced from one another by one or more insulative materials (not illustrated in FIG. 1A for clarity and ease of understanding the description). The conductive structures 120 may be configured to provide sufficient voltage to a channel region (e.g., channel material 151 (FIG. 1C)) of each of the access devices 112 to electrically couple the storage device 114 to, for example, a conductive pillar structure (e.g., pillar structure 126 (FIG. 1C)). The stack structure 125 may intersect the vertical stacks of memory cells 110, such as the vertical stacks of the access devices 112 of the vertical stacks of memory cells 110. In other words, and with reference to FIG. 1A, the stack structure 125 extends through the vertical stacks of access devices 112.

The access devices 112 may be electrically coupled to one or more additional conductive structures (not shown for clarity), which may be configured to enable excess carriers (e.g., holes) to drain from a body region of the access devices 112 during operation of the memory cells 110. The conductive structure may include a conductive metal silicide, a conductive metal nitride, or conductively doped semiconductive material (e.g., silicon, germanium).

The conductive structures 120 may laterally (e.g., in the X-direction) terminate at staircase structures 130 (illustrated in broken lines in FIG. 1A) located at laterally (e.g., in the X-direction) terminal portions of the stack structure 125. As will be described herein, vertically (e.g., in the Z-direction) higher conductive structures 120 may have a smaller lateral dimension (e.g., in the X-direction) than vertically lower conductive structures 120, such that lateral edges of the conductive structures 120 at least partially define steps 124 of the staircase structures 130.

Although FIG. 1A illustrates two staircase structures 130 for every stack structure 125 (e.g., a staircase structure 130 at each lateral (e.g., in the X-direction) end of the stack structure 125), the disclosure is not so limited. In other embodiments, the stack structure 125 includes one staircase structure 130 located at only one lateral end of the stack structure 125.

First conductive contact structures 122 may be in electrical communication with individual conductive structures 120 at the steps 124. In some embodiments, each step 124 is in electrical communication with a first conductive contact structure 122 at each lateral (e.g., in the X-direction) end of the staircase structure 130. In other embodiments, every other step 124 of the staircase structures 130 includes a first conductive contact structure 122 in contact therewith. In other words, every other step 124 of the staircase structures 130 may individually be in contact with a first conductive contact structure 122. In some such embodiments, each step 124 of a first staircase structure 130 at a first lateral end of the stack structure 125 not in electrical contact with a first conductive contact structure 122 may individually be in electrical communication with a first conductive contact structure 122 at a second staircase structure 130 at a second, opposite lateral end of the stack structure 125.

With reference to FIGS. 1A-1D, the first microelectronic device structure 100 may include pillar structures 126 vertically (e.g., in the Z-direction) extending through the first microelectronic device structure 100. The pillar structures 126 may also be referred to herein as "digit lines," "second conductive lines," or "digit line pillar structures." The pillar structures 126 may be electrically coupled to the access devices 112 to facilitate operation of the memory cells 110.

The peripheral regions 150 may include first conductive contact exit regions 152 (FIG. 1A) at a first lateral (e.g., in the Y-direction) side of the staircase structures 130 of each of the stack structures 125. In some embodiments, the first conductive contact exit regions 152 are located at corners of the first microelectronic device structure 100 laterally (e.g., in the Y-direction) neighboring the stack structure 125 in a first lateral direction and laterally (e.g., in the X-direction) neighboring the array region 105 in a second lateral direction. In some embodiments, the first conductive contact exit regions 152 are located at diagonally opposing corners of the first microelectronic device structure 100. In other words, the first conductive contact exit regions 152 may be located at opposing lateral (e.g., in the X-direction and in the Y-direction) ends of the first microelectronic device structure 100. As will be described herein, the first conductive contact exit regions 152 may comprise locations of the first microelectronic device structure 100 at which the first conductive contact structures 122 exit the first microelectronic device structure 100 and electrically connect to a second microelectronic device structure (e.g., second microelectronic device structure 200 (FIG. 2A)).

A second conductive contact exit region 154 (illustrated in broken lines in FIG. 1A) may be located on a second, opposite lateral (e.g., in the X-direction) side of each of the stack structures 125 relative to the first conductive contact exit region 152 of the respective stack structure 125. In some embodiments, the second conductive contact exit regions 154 are located at corners of the first microelectronic device structure 100 laterally (e.g., in the Y-direction) neighboring the stack structure 125 in a first lateral direction and laterally (e.g., in the X-direction) neighboring the array region 105 in a second lateral direction. In some embodiments, the second conductive contact exit regions 154 are located at diagonally opposing corners of the first microelectronic device structure 100. In other words, the second conductive contact exit regions 154 may be located at opposing lateral (e.g., in the X-direction and in the Y-direction) ends of the first microelectronic device structure 100. The second conductive contact exit regions 154 may comprise locations of the first microelectronic device structure 100 at which the pillar structures 126 exit the first microelectronic device structure 100 and electrically connect to a second microelectronic device structure (e.g., second microelectronic device structure 200 (FIG. 2A)). Accordingly, the first conductive contact exit regions 152 and the second conductive contact exit regions 154 may comprise locations defining lateral boundaries within which the respective first conductive contact structures 122 and the pillar structures 126 laterally (e.g., in the X-direction, in the Y-direction) and vertically (e.g., in the Z-direction) extend and contact conductive structures associated with a second microelectronic device structure (e.g., the second microelectronic device structure 200 (FIG. 2B)).

The peripheral regions 150 may further include so-called "socket regions" 115 laterally (e.g., in the Y-direction) neighboring the staircase structures 130 of the stack structure 125 in a direction opposite the first conductive contact exit regions 152. In some embodiments, the socket regions 115 are laterally (e.g., in the Y-direction) between staircase structure 130 of laterally neighboring stack structures 125. As will be described herein, the socket regions 115 may be configured to include one or more conductive contact structures to facilitate conductively coupling portions of the first microelectronic device structure 100 to portions of a second microelectronic device structure (e.g., second microelectronic device structure 200 (FIG. 2B)). In some embodiments, the socket regions 115 electrically couple circuitry of the first base structure 102 to BEOL structures of a second microelectronic device structure (e.g., the second microelectronic device structure 200 (FIG. 2A)).

Figure 1B:
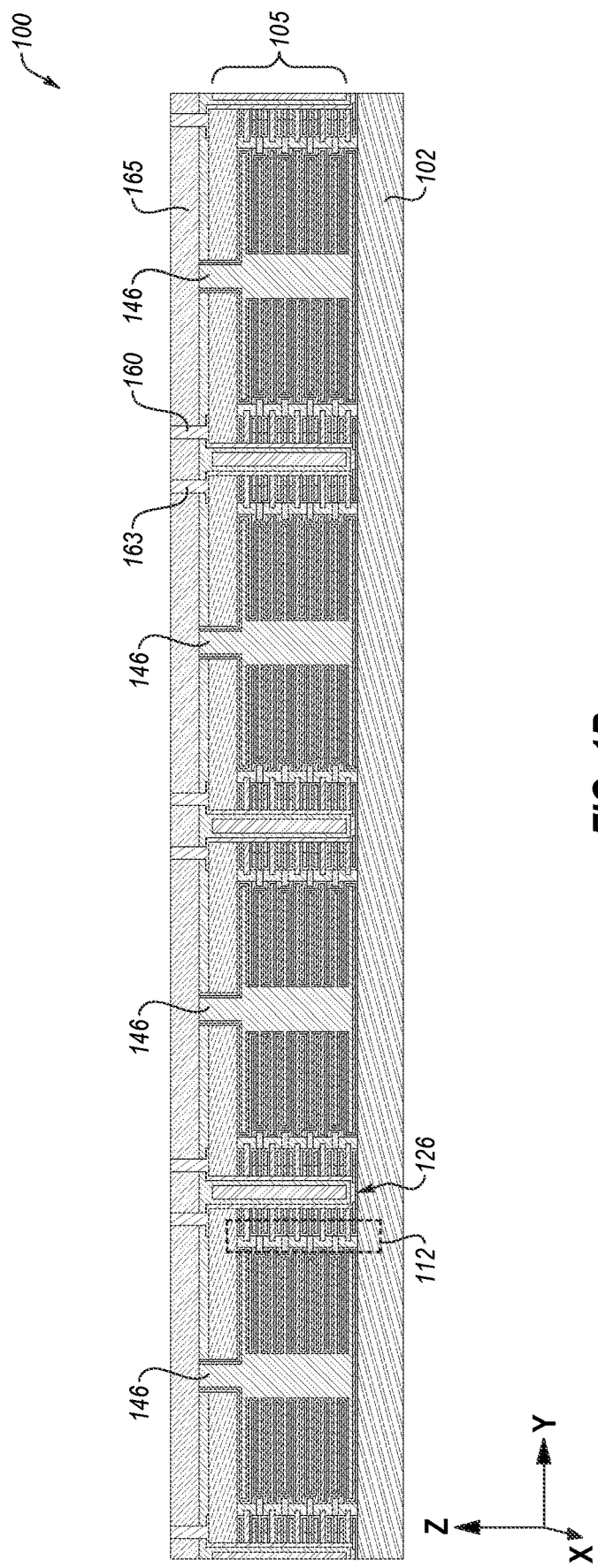
FIG. 1B shows a simplified longitudinal cross-sectional view of the first microelectronic device structure of FIG. 1A.

FIG. 1B is a simplified longitudinal cross-sectional view (ZY-plane) of the first microelectronic device structure 100. FIG. 1C is a simplified partial longitudinal cross-sectional view (ZY-plane) of the first microelectronic device structure 100, taken through section line C-C of FIG. 1A. FIG. 1D is another simplified partial longitudinal cross-sectional view (ZY-plane) of the first microelectronic device structure 100. Referring to FIGS. 1A-1D together, the first microelectronic device structure 100 may include a first base structure 102. The first base structure 102 may include a semiconductive structure (e.g., a semiconductive wafer), or a base semiconductive material on a support structure or construction upon which additional materials and structures of the first microelectronic device structure 100 are formed. For example, the first base structure 102 may comprise a conventional silicon substrate (e.g., a conventional silicon wafer), or another bulk substrate comprising a semiconductive material. As used herein, the term "bulk substrate" means and includes not only silicon substrates, but also silicon-on-insulator (SOI) substrates, such as silicon-on-sapphire (SOS) substrates and silicon-on-glass (SOG) substrates, epitaxial layers of silicon on a base semiconductive foundation, and other substrates formed of and including one or more semiconductive materials (e.g., one or more of a silicon material, such monocrystalline silicon or polycrystalline silicon; silicon-germanium; germanium; gallium arsenide; a gallium nitride; and indium phosphide). In some embodiments, the first base structure 102 comprises a silicon wafer. In addition, the first base structure 102 may include different layers, structures, devices, and/or regions formed therein and/or thereon. For example, the first base structure 102 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), drain supply voltage ($V_{DD}$) regulators, and various chip/deck control circuitry. The devices and circuitry included in the first base structure 102 may employ different conventional conductive metal-oxide-semiconductor (CMOS) devices (e.g., conventional CMOS inverters, conventional CMOS NAND gates, conventional CMOS transmission pass gates, etc.).

In some embodiments, the first base structure 102 comprises conductively doped regions and undoped regions. The conductively doped regions may, for example, be employed as source regions and drain regions for transistors within the first base structure 102 and the undoped regions may, for example, be employed as channel regions for the transistors. In some embodiments, the first base structure 102 comprises a source structure and may comprise, for example, one or more conductive materials, such as one or more of a metal (e.g., W, Ti, Mo, Nb, V, Hf, Ta, Cr, Zr, Fe, Ru, Os, Co, Rh, Ir, Ni, Pd, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, an Mg-based alloy, a Ti-based alloy), a conductive metal-containing material (e.g., a conductive metal nitride, a conductive metal silicide, a conductive metal carbide, a conductive metal oxide), or a doped semiconductor material (e.g., a semiconductor material doped with one or more P-type dopants (e.g., polysilicon doped with at least one P-type dopant, such as one or more of boron, aluminum, and gallium) or one or more N-type conductivity materials (e.g., polysilicon doped with at least one N-type dopant, such as one or more of arsenic, phosphorous, antimony, and bismuth)). In some embodiments, the first base structure 102 comprises conductively doped silicon.

Figure 1C:
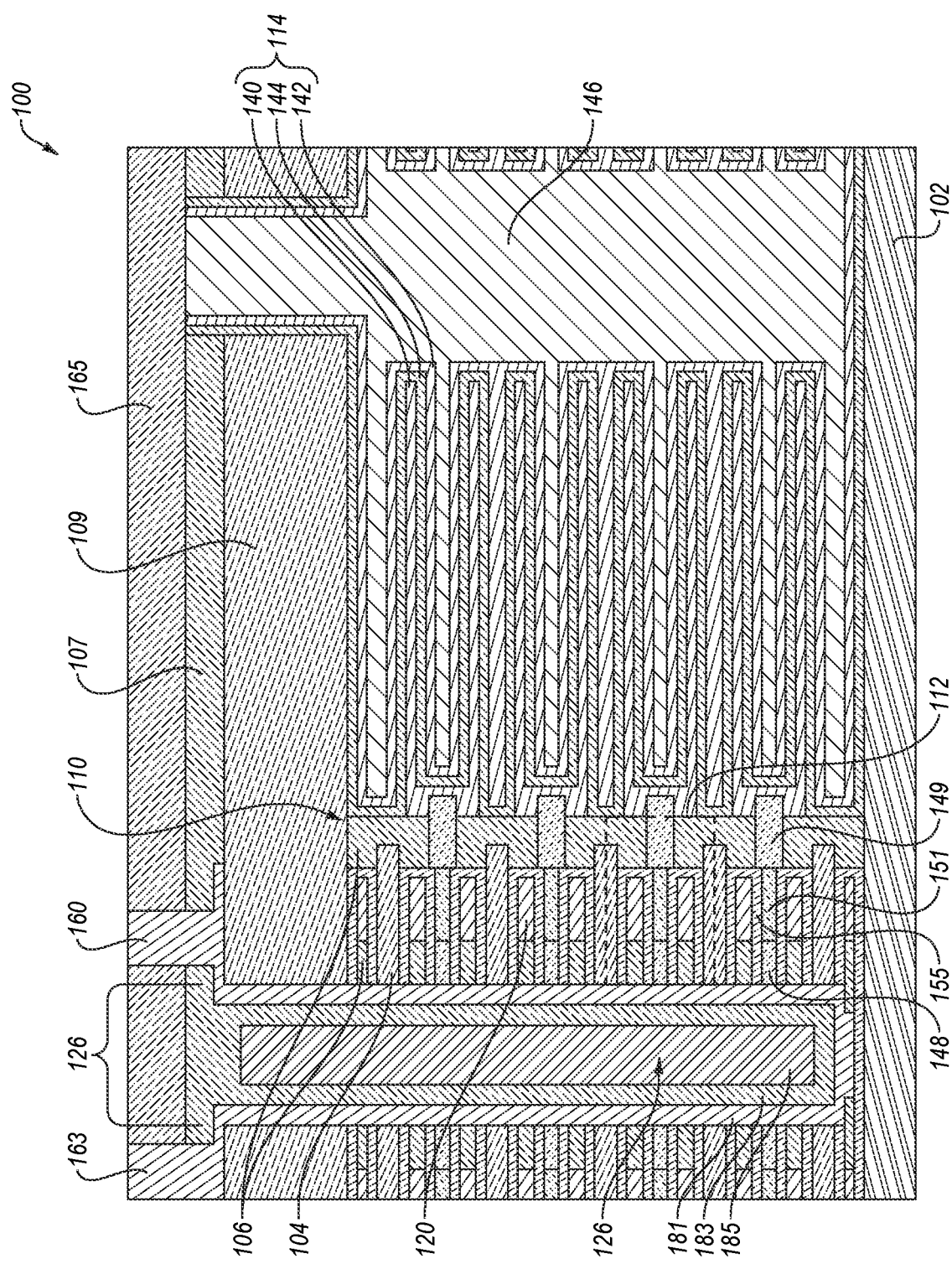
FIGS. 1C and 1D show enlarged, simplified partial longitudinal cross-sectional views of the first microelectronic device structure of FIG. 1A.
Figure 1D:
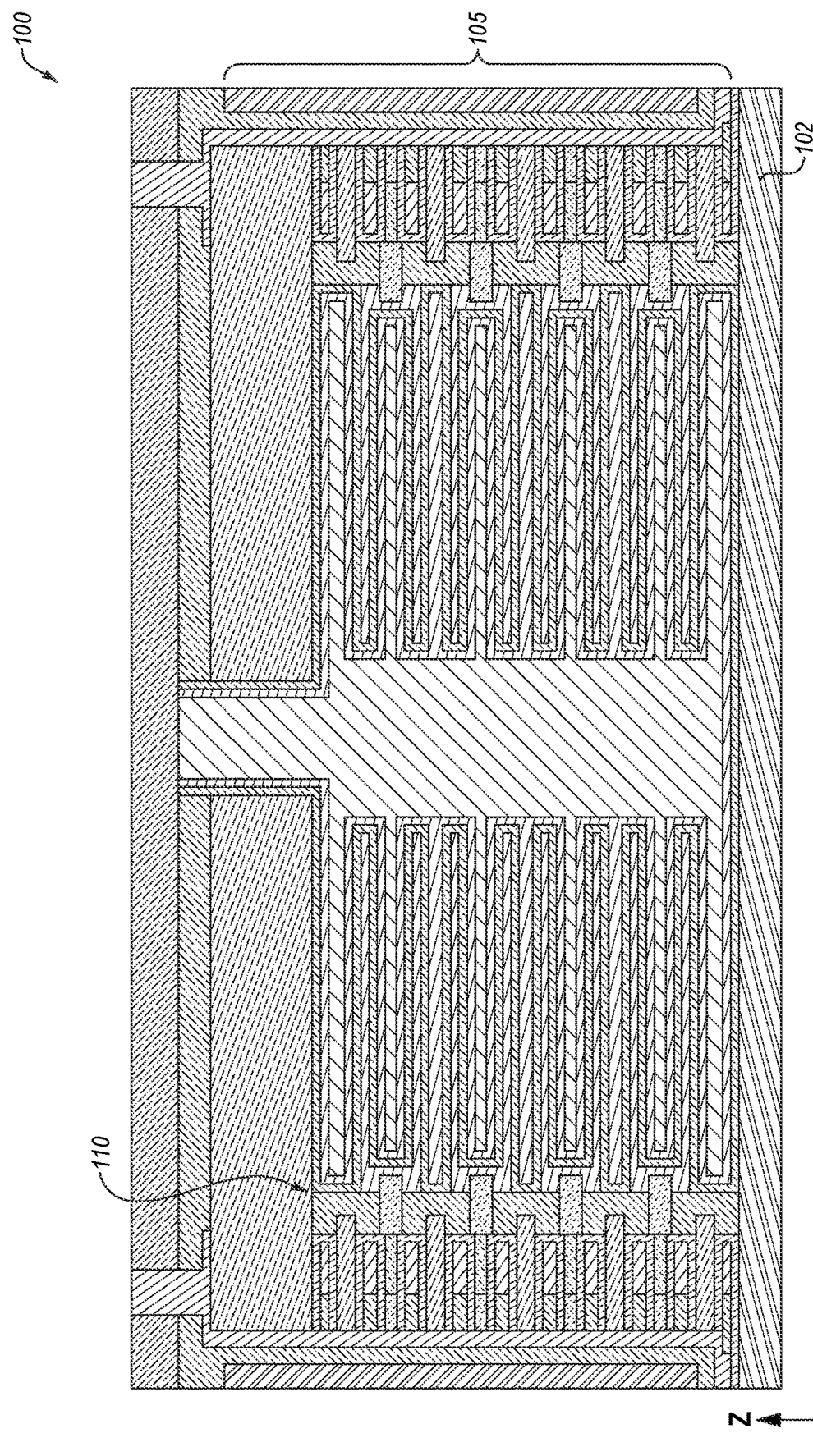

With continued reference to FIGS. 1B-1D, each of the storage devices 114 may include a first electrode 140 (also referred to herein as an "outer electrode," "a first electrode plate," or a "first node"), a second electrode 142 (also referred to herein as an "inner electrode," "a second electrode plate," or a "second node"), and a dielectric material 144 between the first electrode 140 and the second electrode 142. In some such embodiments, the storage devices 114 individually comprise capacitors. However, the disclosure is not so limited and in other embodiments, the storage devices 114 each individually comprise other structures, such as, for example, phase change memory (PCM), resistance random-access memory (RRAM), conductive-bridging random-access memory (conductive bridging RAM), or another structure for storing a logic state.

The first electrode 140 may be formed of and include conductive material such as, for example, one or more of a metal (e.g., tungsten, titanium, nickel, platinum, rhodium, ruthenium, aluminum, copper, molybdenum, iridium, silver, gold), a metal alloy, a metal-containing material (e.g., metal nitrides, metal silicides, metal carbides, metal oxides), a material including at least one of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof, a conductively doped semiconductor material (e.g., conductively doped silicon, conductively doped germanium, conductively doped silicon germanium, etc.), polysilicon, or other materials exhibiting electrical conductivity. In some embodiments, the first electrode 140 comprises titanium nitride.

The second electrode 142 may be formed of and include conductive material. In some embodiments, the second electrode 142 comprises one or more of the materials described above with reference to the first electrode 140. In some embodiments, the second electrode 142 comprises substantially the same material composition as the first electrode 140.

The dielectric material 144 may be formed of and include one or more of silicon dioxide, silicon nitride, polyimide, titanium dioxide ($TiO_2$), tantalum oxide ($Ta_2O_5$), aluminum oxide ($Al_2O_3$), an oxide-nitride-oxide material (e.g., silicon dioxide-silicon nitride-silicon dioxide), strontium titanate ($SrTiO_3$) (STO), barium titanate ($BaTiO_3$), hafnium oxide ($HfO_2$), zirconium oxide ($ZrO_2$), a ferroelectric material (e.g., ferroelectric hafnium oxide, ferroelectric zirconium oxide, lead zirconate titanate (PZT), etc.), or a high-k dielectric material.

The second electrode 142 may be in electrical communication with a conductive structure 146. The conductive structure 146 may be formed of and include conductive material, such as one or more of the materials described above with reference to the second electrode 142. In some embodiments, the conductive structure 146 comprises substantially the same material composition as the second electrode 142. In other embodiments, the conductive structure 146 comprises a different material composition than the second electrode 142.

With continued reference to FIGS. 1B-1D, in some embodiments, the access devices 112 (one of which is illustrated in FIG. 1C) each individually include a source material 148, a drain material 149, and a channel material 151 laterally (e.g., in the Y-direction) between the source material 148 and the drain material 149. The source material 148 and the drain material 149 may each individually comprise semiconductive material (e.g., polysilicon) doped with at least one N-type dopant, such as one or more of arsenic, phosphorous, antimony, and bismuth. In other embodiments, the source material 148 and the drain material 149 each individually comprise semiconductive material doped with at least one P-type dopant, such as one or more of boron, aluminum, and gallium.

In some embodiments, the channel material 151 comprises a semiconductive material (e.g., polysilicon) doped with at least one of at least one N-type dopant and at least one P-type dopant. In some embodiments, the channel material 151 is doped with one of at least one N-type dopant and at least one P-type dopant, and each of the source material 148 and the drain material 149 are each individually doped with the other of the at least one N-type dopant and the at least one P-type dopant.

In some embodiments, the source material 148 of each access device 112 is in electrical communication with a respective pillar structure 126 and the drain material 149 of each access device 112 is electrically connected to a laterally (e.g., in the Y-direction) neighboring storage device 114, such as to the first electrode 140 of the laterally neighboring storage device 114. In some embodiments, each of the pillar structures 126 may include a conductive material outer region 181, an insulative material middle region 183, and a center region 185. In some embodiments, the conductive material outer region 181 may be substantially concentric with the insulative material middle region 183. Furthermore, the center region 185 may be substantially surrounded by the insulative material middle region 183. In some embodiments, the center region 185 includes an insulative material or an airgap. Additionally, the source material 148 of each access device 112 may be in electrical communication with the conductive material outer region 181 of a respective pillar structure 126. In one or more embodiments, the conductive material outer region 181 of the pillar structure 126 may form one or more local digit lines.

The conductive material outer region 181 may include conductive material, such as, for example, a metal, a conductive metal silicide, a conductive metal nitride, or conductively doped semiconductive material (e.g., silicon, germanium). The insulative material middle region 183 and the center region 185 may include any of the insulative materials described herein. In some embodiments, the insulative materials of the insulative material middle region 183 and/or the center region 185 are at least partially determined based on parasitic requirements of associated access devices.

The conductive structures 120 may extend laterally (e.g., in the X-direction) as lines and may each be configured to be operably coupled to a vertically (e.g., in the Z-direction) neighboring channel material 151 of the access devices 112. In other words, a conductive structure 120 may be configured to operably couple to a vertically (e.g., in the Z-direction) neighboring access device 112.

The channel material 151 may be separated from the conductive structures 120 by a dielectric material 155, which may also be referred to herein as a "gate dielectric material." The dielectric material 155 may be formed of and include insulative material. By way of non-limiting example, the dielectric material 155 may comprise one or more of phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride, another gate dielectric material, a dielectric carbon nitride material (e.g., silicon carbon nitride (SiCN)), or a dielectric carboxynitride material (e.g., silicon carboxynitride (SiOCN))).

In some embodiments, insulative structures 104 and additional insulative structures 106 may vertically (e.g., in the Z-direction) intervene between vertically neighboring access devices 112 and vertically neighboring storage devices 114. The additional insulative structures 106 may laterally (e.g., in the Y-direction) neighbor each of the conductive structures 120.

The insulative structures 104 may be formed of and include insulative material. In some embodiments, the insulative structures 104 are each individually formed of and include, for example, an insulative material, such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), and amorphous carbon. In some embodiments, the insulative structures 104 comprise silicon dioxide. Each of the insulative structures 104 may individually include a substantially homogeneous distribution of the at least one insulating material, or a substantially heterogeneous distribution of the at least one insulating material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the insulative structures 104 exhibits a substantially homogeneous distribution of insulative material. In additional embodiments, at least one of the insulative structures 104 exhibits a substantially heterogeneous distribution of at least one insulative material. The insulative structures 104 may, for example, be formed of and include a stack (e.g., laminate) of at least two different insulative materials. The insulative structures 104 may each be substantially planar, and may each individually exhibit a desired thickness.

The additional insulative structures 106 may be formed of and include an insulative material that is different than, and that has an etch selectivity with respect to, the insulative structures 104. In some embodiments, the additional insulative structures 106 are formed of and include a nitride material (e.g., silicon nitride ($Si_3N_4$)) or an oxynitride material (e.g., silicon oxynitride). In some embodiments, the additional insulative structures 106 comprise silicon nitride.

With continued reference to FIGS. 1B-1D, the pillar structures 126 (only one of which is illustrated in the cross-sectional view of FIG. 1C) may vertically (e.g., in the Z-direction) extend into the vertical stack of memory cells 110 and may be in electrical communication with the access devices 112 of the vertical stack of memory cells 110. In some embodiments, the pillar structures 126 each vertically extend through the access devices 112 and are in electrical communication with, for example, the source material 148 of the access devices 112. In some embodiments, the pillar structures 126 are in electrical communication with the first base structure 102.

In some embodiments, insulative structures 109, 107, 165 consecutively overlay the access devices 112 and portions of the storage devices 114. The conductive pillar structures 126 may extend vertically through at least insulative structure 109. The insulative structures 109, 107, 165 may include any of the insulative structures described herein.

A vertically uppermost access device 112 may comprise a select device for operably coupling a pillar structure 126 to which is it coupled to a global digit line through the one or more conductive interconnect structures 161, 163 formed of and including conductive material. The one or more conductive interconnect structures 161, 163 may be in electrical communication with a conductive material outer region 181 (e.g., local digit lines) of a respective pillar structure 126 and may extend through insulative structures 107, 165. The one or more conductive interconnect structures 161, 163 may electrically connect the pillar structures 126 of the first microelectronic device structure 100 to base conductive routing structures 201 (FIG. 2A) and other elements (i.e., multi-capacitor structures) of a second microelectronic device structure 200 (FIG. 2A) subsequently provided (e.g., formed, attached) on or over the first microelectronic device structure 100. The second microelectronic device structure 200 is described in greater detail below in regard to FIGS. 2A-2C.

With collective reference to FIGS. 1A-1D, while the disclosure describes the first microelectronic device structure 100 as a 3D dynamic random-access memory (DRAM) device structure, the disclosure is not so limited, and the first microelectronic device structure 100 may instead be configured as a different memory device structure to form assemblies, devices, and systems in accordance with embodiments of the disclosure, such as assemblies, devices, and systems including different memory device structures in place of the first microelectronic device structure 100 in the configurations described below with reference to FIGS. 2A through 8. Non-limiting examples of other memory device structures that may be included in place of and/or in combination with the first microelectronic device structure 100 within assemblies, devices, and systems of the disclosure include other DRAM device structures including arrays of DRAM cells, holographic random-access memory (HRAM) device structures including arrays of HRAM cells, a 2D memory array structures, and cross-point memory (MTX) device structures including cross-point memory arrays.

Figure 2A:
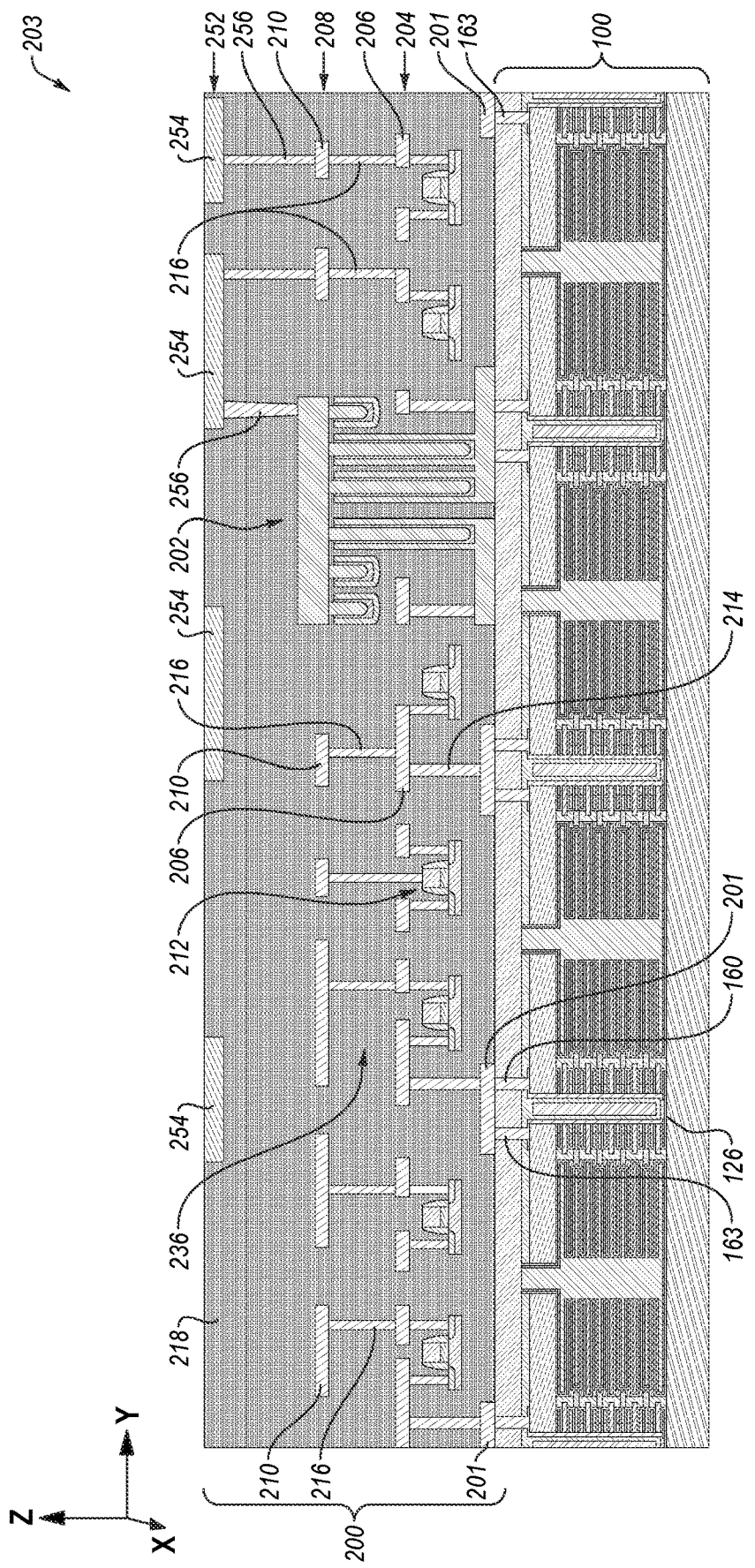
FIG. 2A shows a simplified longitudinal cross-sectional view of a microelectronic device structure assembly including the first microelectronic device structure of FIGS. 1A-1D and a second microelectronic device structure, in accordance with embodiments of the disclosure.
Figure 2B:
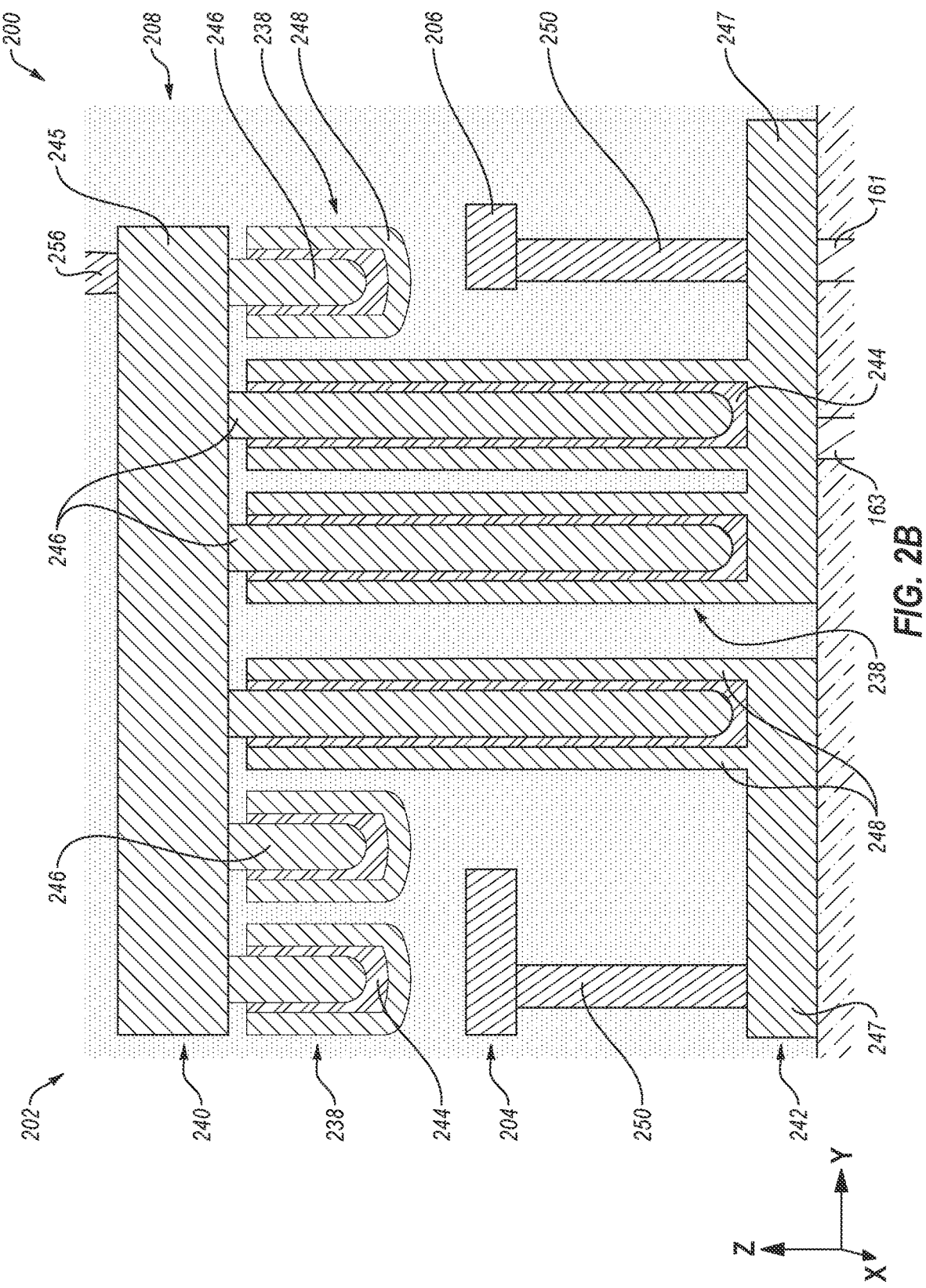
FIG. 2B shows a simplified, enlarged longitudinal cross-sectional view of a multi-capacitor structure of the second microelectronic device structure of FIG. 2A.
Figure 2C:
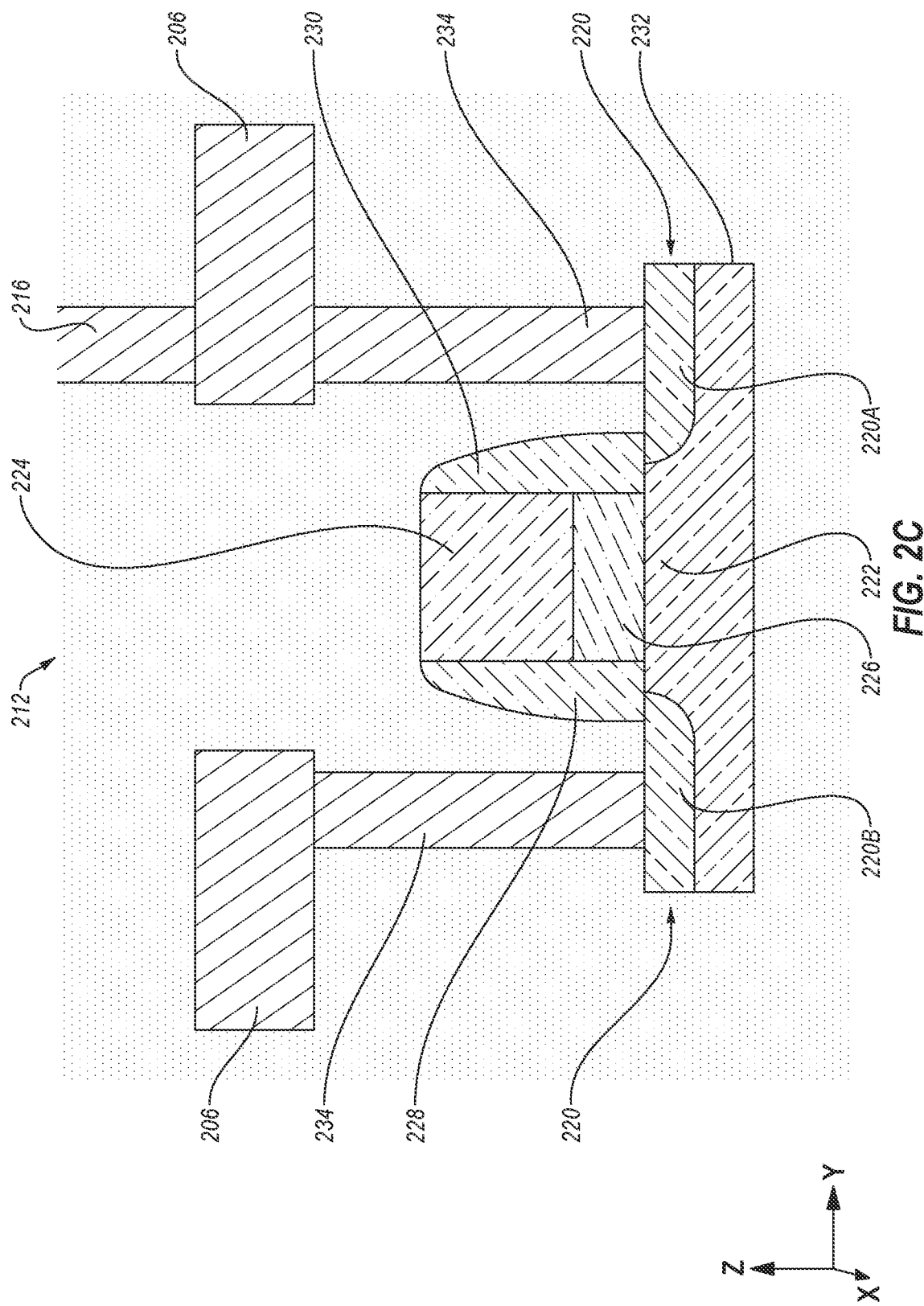
FIG. 2C shows a simplified, enlarged longitudinal cross-sectional view of a transistor of the second microelectronic device structure of FIG. 2A.

FIG. 2A is a simplified longitudinal cross-sectional view (YZ-plane) of a microelectronic device structure assembly 203 including the first microelectronic device structure 100 and a second microelectronic device structure 200 provided (e.g., formed, attached) on or over the first microelectronic device structure 100. FIG. 2B is a simplified, enlarged cross-sectional view of a first multi-capacitor structure 202 of the second microelectronic device structure 200 from the perspective of the X-direction (so as to depict a YZ-plane) according to one or more embodiments of the disclosure. FIG. 2C is a simplified, enlarged cross-sectional view of a transistor 212 of the second microelectronic device structure 200 from the perspective of the X-direction (so as to depict a YZ-plane) according to one or more embodiments of the disclosure. Referring to FIGS. 2A and 2B together, the second microelectronic device structure 200 may be formed to have an arrangement of different regions (e.g., array regions, digit line exit regions, word line exit regions, socket regions) corresponding to (e.g., substantially the same as) the arrangement of different regions previously described with reference to FIGS. 1A-1D.

The second microelectronic device structure 200 may be formed to include one or more control logic devices (e.g., CMOS devices) and circuitry. In some embodiments, the second microelectronic device structure 200 includes so-called high-performance (HP) control logic devices (e.g., HP CMOS devices). For example, the circuitry of the second microelectronic device structure 200 may be configured to operate at applied voltages less than or equal to (e.g., less than) about 3.6 volts (V), such as within a range of from about 0.7 V to about 3.6 V (e.g., from about 0.7 V to about 2.4 V, from about 0.7 V to about 1.8 V, from about 0.9 V to about 1.2 V, from about 0.95 V to about 1.15 V, or about 1.1 V).

As shown in FIGS. 2A and 2B, the second microelectronic device structure 200 may be formed to include the base conductive routing structures 201, at least one first routing tier 204 including first routing structures 206, at least one second routing tier 208 including second routing structures 210, transistors 212, first contact structures 214 extending between the base conductive routing structures 201 and the first routing structures 206, second contact structures 216 extending between the first routing structures 206 and the second routing structures 210, and at least one first isolation material 218. Some of the base conductive routing structures 201 contact some of the first contact structures 214. Some of the first routing structures 206 contact some of the second contact structures 216. Additionally, as is described in greater detail below, the second microelectronic device structure 200 may include "back end of line" (BEOL) structures formed over the second routing tier 208.

The at least one first isolation material 218 may substantially cover and surround the base conductive routing structures 201, the first routing structures 206, the second routing structures 210, the transistors 212, the first contact structures 214, the second contact structures 216, and at least portions of the BEOL structures.

The first contact structures 214 may individually be formed of and include conductive material. By way of non-limiting example, the first contact structures 214 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first contact structures 214 are formed of and include W. In additional embodiments, the first contact structures 214 are formed of and include Cu.

The second contact structures 216 may individually be formed of and include conductive material. By way of non-limiting example, the second contact structures 216 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the second contact structures 216 are formed of and include W. In additional embodiments, the second contact structures 216 are formed of and include Cu. A material composition of the second contact structures 216 may be substantially the same as a material composition of the first contact structures 214, or the material composition of one or more of the second contact structures 216 may be different than the material composition of the first contact structures 214.

The first and/or second routing structures 206, 210 of the first and second routing tiers 204, 208 may be formed of and include conductive material. By way of non-limiting example, the first and/or second routing structures 206, 210 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the first and/or second routing structures 206, 210 are formed of and include W. In additional embodiments, the first and/or second routing structures 206, 210 are formed of and include Cu. At least some of the first and/or second routing structures 206, 210 may be employed as local routing structures of a microelectronic device (e.g., a memory device, such as a DRAM device) of the disclosure.

In some embodiments, at least some of the base conductive routing structures 201 are employed as global conductive structures (e.g., global digit lines) for a microelectronic device including the microelectronic device structure assembly 203. Furthermore, each of the base conductive routing structures 201 may be in electrical communication with more than one (e.g., two, three, four, six, eight) of the pillar structures 126. The base conductive routing structures 201 may independently be formed of and include conductive material. In some embodiments, the base conductive routing structures 201 individually comprise tungsten. In other embodiments, each of the base conductive routing structures 201 individually comprise Cu.

Referring collectively to FIGS. 2A and 2C, the transistors 212 may individually be formed to include conductively doped regions 220, a channel region 222, a gate structure 224, a gate dielectric material 226, and spacer structures 228, 230. In some embodiments, the channel region 222 is within a base semiconductor structure 232. The conductively doped regions 220 may be formed within the base semiconductor structure 232; the channel region 222 may be within the base semiconductor structure 232 and may be horizontally interposed between the conductively doped regions 220 thereof; the gate structure 224 may vertically overlie the channel region 222; and the gate dielectric material 226 (e.g., a dielectric oxide) may be vertically interposed (e.g., in the Z-direction) between the gate structure 224 and the channel region 222. The conductively doped regions 220 of an individual transistor 212 may include a source region 220A and a drain region 220B.

For an individual transistor 212, the conductively doped regions 220 thereof may comprise semiconductor material of the base semiconductor structure 232 doped with one or more desired conductivity-enhancing dopants. In some embodiments, the conductively doped regions 220 of the transistor 212 comprise semiconductor material (e.g., silicon) doped with at least one N-type dopant (e.g., one or more of phosphorus, arsenic, antimony, and bismuth). In some of such embodiments, the channel region 222 of the transistor 212 comprises the semiconductor material doped with at least one P-type dopant (e.g., one or more of boron, aluminum, and gallium). In some other of such embodiments, the channel region 222 of the transistor 212 comprises substantially undoped semiconductor material (e.g., substantially undoped silicon). In additional embodiments, for an individual transistor 212, the conductively doped regions 220 thereof comprise semiconductor material (e.g., silicon) doped with at least one P-type dopant (e.g., one or more of boron, aluminum, and gallium). In some of such additional embodiments, the channel region 222 of the transistor 212 comprises the semiconductor material doped with at least one N-type dopant (e.g., one or more of phosphorus, arsenic, antimony, and bismuth). In some other of such additional embodiments, the channel region 222 of the transistor 212 comprises substantially undoped semiconductor material (e.g., substantially undoped silicon).

The gate structures 224 (e.g., gate electrodes) may individually horizontally extend (e.g., in the X-direction) between and be employed by multiple transistors 212. The gate structures 224 may be formed of and include conductive material. The gate structures 224 may individually be substantially homogeneous, or the gate structures 224 may individually be heterogeneous. In some embodiments, the gate structures 224 are each substantially homogeneous. In additional embodiments, the gate structures 224 are each heterogeneous. Individual gate structures 224 may, for example, be formed of and include a stack of at least two different conductive materials.

The spacer structures 228, 230 of each individual transistor 212 may be horizontally adjacent in the Y-direction to the gate structure 224 and the gate dielectric material 226. In particular, the spacer structures 228, 230 may be on opposing sides of the gate structure 224 and the gate dielectric material 226 in the Y-direction. In some embodiments, the spacer structures 228, 230 are formed of and include a dielectric oxide material, such as $SiO_x$ (e.g., $SiO_2$).

As is described in greater detail below, in some embodiments, the transistors 212 are utilized in conjunction with one or more first multi-capacitor structures 202 to operate and control logic devices (e.g., pumps). For example, the transistors 212 may include control logic (e.g., control pump) circuitry transistors.

Referring still to FIGS. 2A and 2C collectively, third contact structures 234 may individually be formed to vertically extend between the base semiconductor structure 232 and the first routing structures 206. As a result, the third contact structures 234 may couple the base semiconductor structure 232 (and, hence, the transistors 212) to one or more of the first routing structures 206 of the first routing tier 204. The third contact structures 234 may individually be formed of and include conductive material. By way of non-limiting example, the third contact structures 234 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the third contact structures 234 are formed of and include W. In additional embodiments, the third contact structures 234 are formed of and include Cu. A material composition of the third contact structures 234 may be substantially the same as a material composition of the first and/or second contact structures 214, 216, or the material composition of one or more of the third contact structures 234 may be different than the material composition of one or more of the first and/or second contact structures 214, 216.

While FIG. 2A only shows two routing tiers (i.e., the first and second routing tiers 204, 208) including the first and/or second routing structures 206, 210, additional routing tiers each individually including a desired arrangement (e.g., pattern) of routing structures may be formed. By way of non-limiting example, two or more (e.g., three or more) additional routing tiers may be formed, wherein different routing tiers are vertically offset from one another and each individually include a desired arrangement of routing structures therein. At least some of the routing structures within at least one of the additional routing tiers may be coupled to at least some of the routing structures within at least one other of the additional routing tiers by way of conductive interconnect structures.

With continued collective reference to FIGS. 2A and 2C, the transistors 212, the first routing structures 206, the second routing structures 210, the third contact structures 234, the first contact structures 214, and the second contact structures 216 may form control logic circuitry of various control logic devices 236 (FIG. 2A) configured to control various operations of various features (e.g., the memory cells 110 (FIG. 1A)) of a microelectronic device (e.g., a memory device, such as a 3D DRAM device (e.g., the first microelectronic device structure 100)). As mentioned above, in some embodiments, the control logic devices 236 comprise CMOS circuitry. As a non-limiting example, the control logic devices 236 may include one or more (e.g., each) of voltage pumps (also referred to as charge pumps) (e.g., $V_{CCP}$ charge pumps, $V_{NEGWL}$ charge pumps, DVC2 charge pumps), delay-locked loop (DLL) circuitry (e.g., ring oscillators), drain supply voltage ($V_{dd}$) regulators, and various chip/deck control circuitry, block switches (e.g., configured and operated for selection of memory blocks of the array region 105), drivers (e.g., string drivers, column drivers), and select devices (e.g., row select devices, column select devices). In some embodiments, the control logic devices 236 further include various control circuitry associated with the array region 105 (FIG. 1A). For example, the control devices of the one or more additional regions may include logic for controlling the regulation of voltage references when biasing particular memory blocks of the array region 105 into a read or write state, or for generating row and column addresses.

Additional examples of the control logic devices 236 include devices configured to control column operations for arrays (e.g., memory element array(s), access device array (s)) within the array region 105 (FIG. 1A) of the first microelectronic device structure 100 (FIG. 1A), such as one or more (e.g., each) of decoders (e.g., local deck decoders, column decoders), repair circuitry (e.g., column repair circuitry), memory test devices, array multiplexers (MUX), and error checking and correction (ECC) devices; control devices configured to control row operations for arrays (e.g., memory element array(s), access device array(s)) within the array region 105 of the first microelectronic device structure 100, such as one or more (e.g., each) of decoders (e.g., local deck decoders, row decoders), repair circuitry (e.g., row repair circuitry), memory test devices, MUX, ECC devices, self-refresh/wear leveling devices, page buffers, data paths, I/O devices (e.g., local I/O devices) and controller logic (timing circuitry, clock devices (e.g., a global clock device)), deck enable, read/write circuitry, address circuitry, or other logic devices and circuitry. In some embodiments, the one or more additional regions include drivers (e.g., one or more column drivers) but do not include word line drivers. Different regions (e.g., an array region, a socket region) may have different control logic devices 236 formed within horizontal boundaries thereof.

Referring to FIGS. 2A and 2B together, as noted above, the second microelectronic device structure 200 includes one or more first multi-capacitor structures 202. In some embodiments, the first multi-capacitor structure 202 is formed amongst (e.g., horizontally neighboring) and between the control logic devices 236 of the second microelectronic device structure 200. In one or more embodiments, the first multi-capacitor structure 202 is utilized to regulate voltages supplied to one or more of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., main word line drivers, sub word line drivers (SWD)), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, array multiplexers (MUX), error checking and correction (ECC) devices, self-refresh/wear leveling devices, and other chip/deck control circuitry. For instance, the capacitors of the first multi-capacitor structure 202 (described below) may support and/ or form so called "decoupling capacitors" and/or "pump capacitors."

The first multi-capacitor structure 202 may include capacitors 238 (e.g., multiple capacitors) arranged horizontally adjacent to each other in one or more of the X-direction and the Y-direction. In some embodiments, the capacitors 238 include metal-insulator-metal (MIM) capacitors. For example, the capacitors 238 may include a top electrode 240 (e.g., top plate) and a bottom electrode 242 (e.g., bottom plate) vertically neighboring the top electrode 240. The top electrode 240 and the bottom electrode 242 may be separated by a capacitor dielectric 244. In some embodiments, the top electrode 240 and the bottom electrode 242 are common to the capacitors 238. In some embodiments, the top electrode 240 includes a top plate portion 245 and first extension portions 246 (e.g., fingers) extending downward from the top plate portion 245, and the bottom electrode 242 may include a bottom plate portion 247 and second extension portions 248 correlating to the first extension portions 246 of the top electrode 240 and extending upward from the bottom plate portion 247 of the bottom electrode 242. In some embodiments, the first extension portions 246 have a general rod-shaped cross-section in the YZ-plane, and the second extension portions 248 has a general U-shaped cross-section in the YZ-plane, as depicted in FIG. 2B.

In some embodiments, each of the second extension portions 248 of the bottom electrode 242 at least substantially surrounds (e.g., be horizontally neighboring to) at least two opposing sides of a correlating first extension portion 246 of the top electrode 240 in the Y-direction. For example, the correlating first extension portion 246 may extend between two opposing portions of the second extension portions 248 of the bottom electrode 242. In some embodiments, a given number of second extension portions 248 surround all sides of a correlating first extension portion 246 in horizontal directions. Furthermore, each of the second extension portions 248 of the bottom electrode 242 may at least substantially surround two or more sides of a correlating first extension portion 246 along substantially an entire vertical length (e.g., height) of the first extension portion 246. Additionally, the capacitor dielectric 244 may be formed between the first extension portion 246 and the second extension portion 248 of a given capacitor 238.

In one or more embodiments, vertical lengths and a number of the capacitors 238 of the first multi-capacitor structure 202 are selected to achieve a selected amount of effective surface area. For example, vertical lengths and a number of the capacitors 238 of the first multi-capacitor structure 202 may be selected to provide a selected amount of effective surface area. Selection of the amount of effective surface area of the first multi-capacitor structure 202 enables selection of a capacitance of the first multi-capacitor structure 202. The lengths and number of capacitors 238 of the first multi-capacitor structure 202 may be selected to provide a desired capacitance while satisfying given space requirements within the second microelectronic device structure 200. In some embodiments, the capacitance of the first multi-capacitor structure 202 is selected based on voltage requirements of logic devices (e.g., charge pumps) to which the first multi-capacitor structure 202 supplies and regulates voltage.

Referring still to FIGS. 2A and 2B, although some portions of the bottom electrode 242 are not shown as being connected to other portions of the bottom electrode 242 within the depicted YZ-plane, the differing portions of the bottom electrode 242 may be connected to each other in regions of the second microelectronic device structure 200 extending into or out of the page (e.g., in the X-direction) according to the view depicted in FIGS. 2A and 2B.

The top plate portion 245 of the top electrode 240 of the first multi-capacitor structure 202 may be vertically aligned with the second routing tier 208 of the second microelectronic device structure 200. In some embodiments, the top plate portion 245 of the top electrode 240 comprises a portion of the second routing structures 210 of the second routing tier 208. Put another way, the top plate portion 245 of the top electrode 240 may be part of the second routing tier 208, may be formed during the formation of the second routing structures 210, and may have substantially the same material composition as the second routing structures 210. Additionally, the bottom plate portion 247 of the bottom electrode 242 of the first multi-capacitor structure 202 may be at least partially (e.g., substantially) vertically aligned with the same routing tier as the base conductive routing structures 201. In some embodiments, the bottom plate portion 247 of the bottom electrode 242 comprises a portion of the base conductive routing structures 201. Put another way, the bottom plate portion 247 of the bottom electrode 242 may be part of the routing tier including the base conductive routing structures 201, may be formed during the formation of the base conductive routing structures 201, and may have substantially the same material composition as the base conductive routing structures 201. Moreover, the bottom electrode 242 of the first multi-capacitor structure 202 may be in electrical connection with one or more of the conductive interconnect structures 161, 163, and as a result, memory cells, of the first microelectronic device structure 100 underlying the second microelectronic device structure 200. In one or more embodiments, the first multi-capacitor structure 202 includes fourth contact structures 250 contacting the bottom electrode 242 of the first multi-capacitor structure 202 and extending to second routing structures 206 of the second routing tier 208.

With continued reference to FIGS. 2A and 2B, the first multi-capacitor structure 202 may include some capacitors 238 (e.g., longer capacitors) extending a full vertical distance between the top plate portion 245 of the top electrode 240 and the bottom plate portion 247 of the bottom electrode 242 and some capacitors 238 (e.g., shorter capacitors) extending only a partial distance between the top plate portion 245 of the top electrode 240 and the bottom plate portion 247 of the bottom electrode 242. For example, the first and second extension portions 246, 248 of some of the capacitors 238 (e.g., the shorter capacitors) may span only a portion of the vertical distance between the top plate portion 245 of the top electrode 240 and the bottom plate portion 247 of the bottom electrode 242. In some embodiments, the capacitors 238 extend downward from the top plate portion 245 of the top electrode 240.

As shown in FIGS. 2A and 2B, the bottom plate portion 247 of the bottom electrode 242 may be segmented in the Y-direction within the YZ-plane. For example, the bottom plate portion 247 may have a first segment and a second segment. Moreover, the first segment and the second segment of the bottom plate portion 247 may be connected to each other within regions of the second microelectronic device structure 200 extending into or out of the page (e.g., in the X-direction) according to the view depicted in FIGS. 2A and 2B. In such embodiments, some of the capacitors 238 are coupled to the first segment of the bottom plate portion 247 and others of the capacitors 238 are coupled to the second segment of the bottom plate portion 247.

The capacitor dielectric 244 may be formed of an insulative material including, but not limited to, insulative oxide material or insulative nitride material. By way of example only, the capacitor dielectric 244 may comprise, consist essentially of, or consist of hafnium oxide, silicon dioxide, silicon nitride, zirconium oxide, or combinations thereof. In some embodiments, the capacitor dielectric 244 is zirconium oxide. The capacitor dielectric 244 may be formed by conventional techniques, such as by a physical vapor deposition ("PVD") technique, a CVD technique, or an ALD technique. PVD includes, but is not limited to, sputtering, evaporation, or ionized PVD.

The top electrode 240 may be formed of conductive material including, but not limited to, metal (e.g., platinum, titanium, tungsten, ruthenium), metal-containing material (e.g., a metal nitride, a metal silicide,), and/or conductively doped semiconductor material (e.g., conductively doped silicon, conductively doped germanium). The top electrode 240 may be formed by conventional techniques, such as by a PVD technique, a CVD technique, or an ALD technique. Widths of the first extension portions 246 of the top electrode 240 may be substantially equal along the vertical lengths thereof.

The bottom electrode 242 may be formed of conductive material including, but not limited to, metal (e.g., platinum, titanium, tungsten, ruthenium), a metal-containing composition (e.g., metal nitride, metal silicide,), and/or conductively doped semiconductor material (e.g., conductively doped silicon, conductively doped germanium, etc.). The bottom electrode 242 may be formed by conventional techniques, such as by a PVD technique, a CVD technique, or an ALD technique. Widths of the second extension portions 248 of the bottom electrode 242 may be substantially equal along the vertical lengths thereof.

The fourth contact structures 250 may individually be formed of and include conductive material. By way of non-limiting example, the fourth contact structures 250 may be formed of and include one or more of at least one metal, at least one alloy, and at least one conductive metal-containing material (e.g., a conductive metal nitride, a conductive metal silicide, a conductive metal carbide, a conductive metal oxide). In some embodiments, the fourth contact structures 250 are formed of and include W. In additional embodiments, the fourth contact structures 250 are formed of and include Cu. A material composition of the fourth contact structures 250 may be substantially the same as a material composition of one or more of the other contact structures of the first and second microelectronic device structures 100, 200, or the material composition of the fourth contact structures 250 may be different than the material composition of the one or more of the other contact structures of the first and second microelectronic device structures 100, 200.

In some embodiments, the second microelectronic device structure 200 is formed on or over the first microelectronic device structure 100 to form the microelectronic device structure assembly 203. For example, features (e.g., structures, materials, devices, regions) of the second microelectronic device structure 200 may be formed on or over an upper boundary of the first microelectronic device structure 100 using conventional process (e.g., conventional material deposition processes, conventional material removal processes, conventional photolithographic patterning processes), such as conventional silicon-on-insulator (SOI) formation processes. In additional embodiments, the second microelectronic device structure 200 is formed separate from the first microelectronic device structure 100, and is then attached (e.g., bonded) to first microelectronic device structure 100 to form the microelectronic device structure assembly 203. For example, the first microelectronic device structure 100 and the second microelectronic device structure 200 may be formed separate from one another (e.g., as separate wafers), and then the second microelectronic device structure 200 may be bonded to first microelectronic device structure 100 by way of one or more of dielectric-dielectric bonding (e.g., oxide-oxide bonding) and metal-metal bonding. In some embodiments, the first microelectronic device structure 100 and the second microelectronic device structure 200 are formed separate from one another and then the first isolation material 218 of the second microelectronic device structure 200 is bonded (e.g., oxide-oxide bonded) to the insulative structures 165 to form the microelectronic device structure assembly 203.

Referring to FIG. 2A, as mentioned above, BEOL structures may be formed over the second routing tier 208. For example, at least one third routing tier 252 including third routing structures 254 (e.g., BEOL structures) may be formed over the second routing tier 208. Fifth contact structures 256 may vertically extend from and between the third routing tier 252 and the second routing tier 208. Some of the fifth contact structures 256 may extend between and may contact some second routing structures 210 and some third routing structures 254. Additionally, some other of the fifth contact structures 256 may extend between and may contact top electrodes 240 of first multi-capacitor structures 202 and some third routing structures 254. Moreover, while only one tier of BEOL structures is depicted in FIG. 2A, the disclosure is not so limited. Rather, multiple stacked tiers of BEOL structures may be formed over the second routing tier 208 including multiple stacked routing tiers with contact structures extending therebetween.

The third routing structures 254 and the fifth contact structures 256 may each be formed of and include conductive material. By way of non-limiting example, the third routing structures 254 and the fifth contact structures 256 may individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the third routing structures 254 are each formed of and include Cu, and the fifth contact structures 256 are each formed of and include W.

As noted above, the at least one first isolation material 218 may be formed on or over portions of third routing structures 254, the fifth contact structures 256, and the first multi-capacitor structure 202. In some embodiments, the at least one first isolation material 218 is formed of and includes a dielectric oxide material, such as $SiO_x$ (e.g., $SiO_2$). The at least one first isolation material 218 may be substantially homogeneous, or the at least one first isolation material 218 may be heterogeneous. The at least one first isolation material 218 may, for example, be formed of and include a stack of at least two different dielectric materials.

Figure 3:
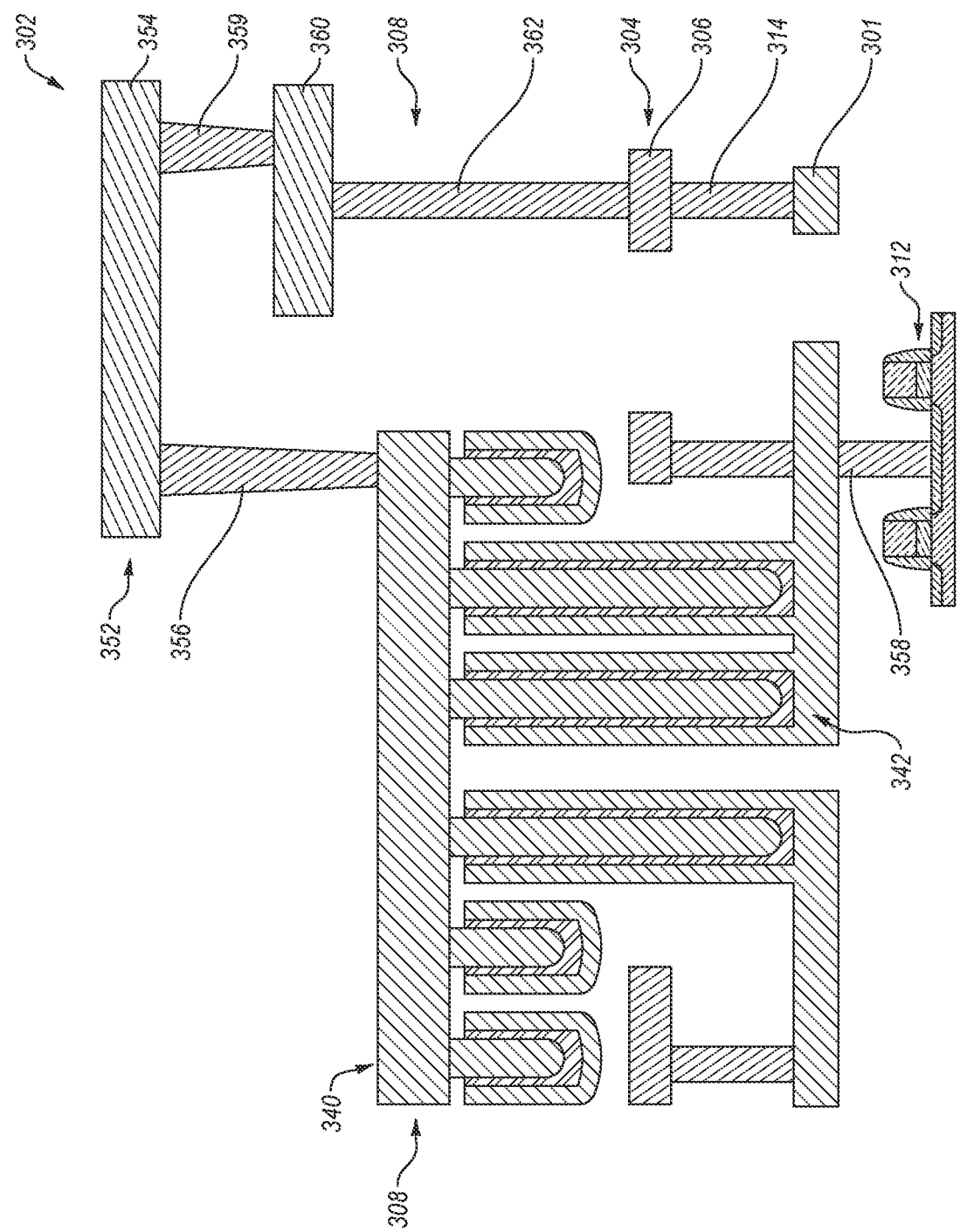
FIG. 3 shows a simplified longitudinal cross-sectional view of a multi-capacitor structure of the second microelectronic device structure, in accordance with additional embodiments of the disclosure.
Figure 3:
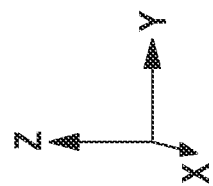
Figure 4:
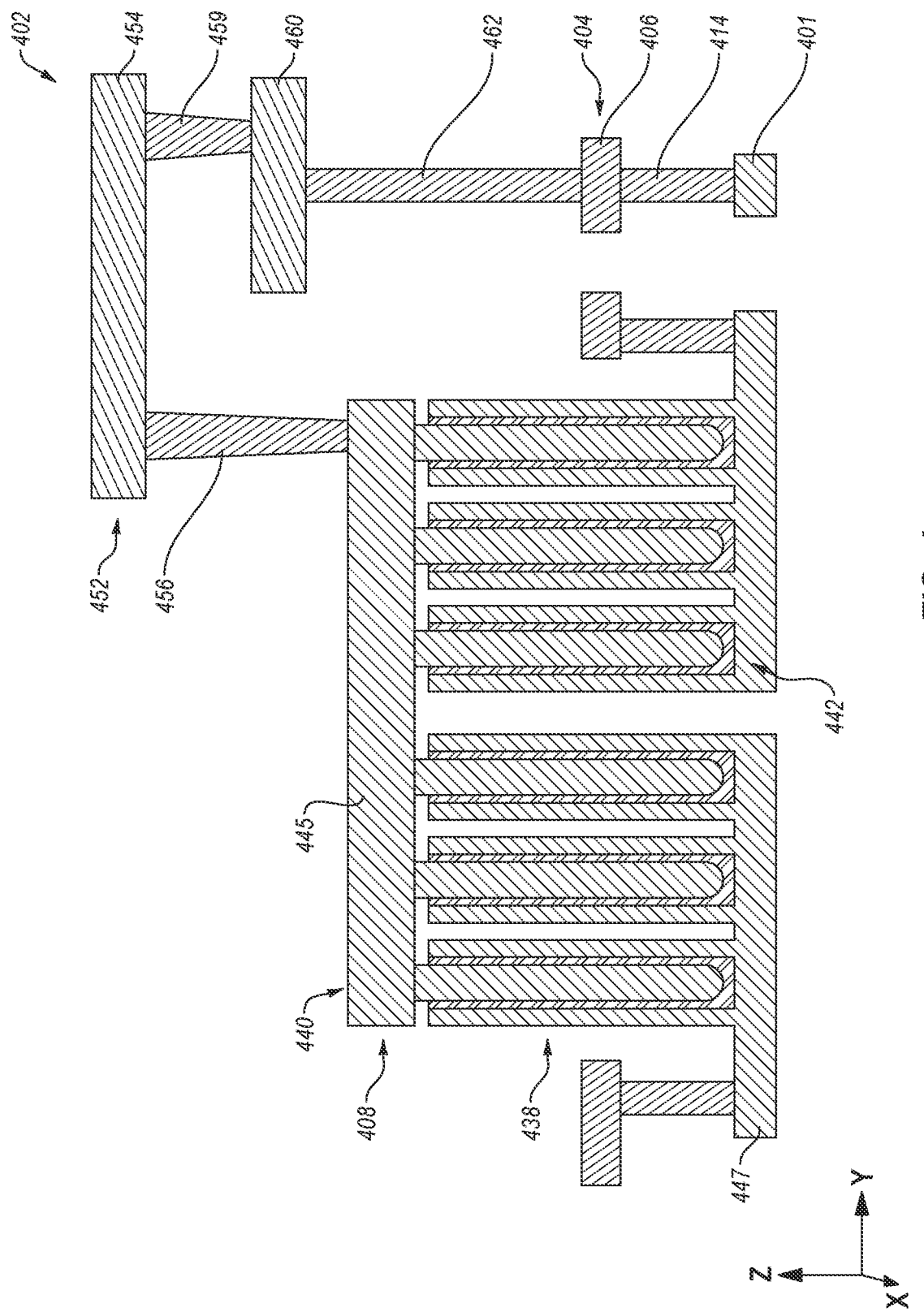
FIG. 4 shows a simplified longitudinal cross-sectional view of a multi-capacitor structure of the second microelectronic device structure, in accordance with additional embodiments of the disclosure.
Figure 5:
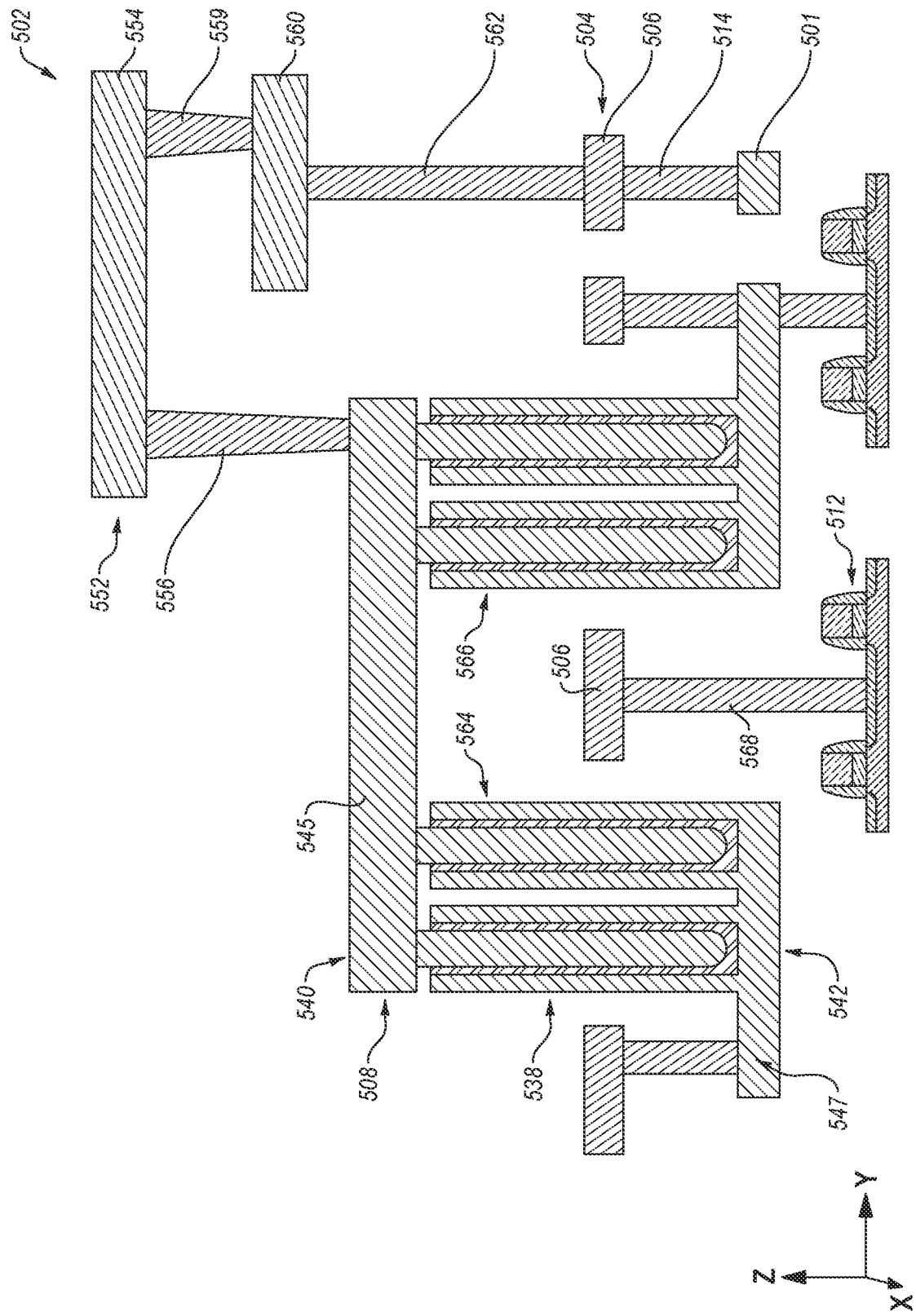
FIG. 5 shows a simplified longitudinal cross-sectional view of a multi-capacitor structure of the second microelectronic device structure, in accordance with additional embodiments of the disclosure.

The first multi-capacitor structure 202 may include various configurations. FIGS. 3-5 depict various first multi-capacitor structures 302, 402, 502, respectively, according to additional embodiments of the disclosure. In particular, FIGS. 3-5 respectively depict simplified longitudinal cross-sectional views of the first multi-capacitor structures 302, 402, 502 from the perspective of the X-direction (so as to depict a YZ-plane). Components of the first multi-capacitor structures 302, 402, 502 that are similar to corresponding components of the first microelectronic device structure 100 may retain the same numerical designation, except that reference numerals 2XX are replaced with 3XX, 4XX, and 5XX, respectively. Put another way, in FIGS. 3-5 and the associated description, features (e.g., structures, materials, devices, regions) of the first multi-capacitor structures 302, 402, 502 functionally similar to previously described features (e.g., structures, materials, devices, regions) of the first multi-capacitor structure 202 described with reference to FIGS. 2A and 2B are referred to with similar reference numerals incremented by 100. To avoid repetition, not all features shown in FIGS. 3-5 are described in detail herein. Rather, unless described otherwise below, in FIGS. 3-5, a feature designated by a reference numeral that is a 100 increment of the reference numeral of a feature previously described with reference to one or more of FIGS. 2A and 2B will be understood to be substantially similar to the previously described feature. By way of non-limiting example, unless described otherwise below, a feature designated by the reference numerals 342, 442, and 542 in FIGS. 3-5, respectively, will be understood to be substantially similar to the bottom electrode 242 previously described herein with reference to FIG. 2A.

FIG. 3 depicts a first multi-capacitor structure 302 that is substantially similar to the first multi-capacitor structure 202 of FIGS. 2A and 2B. For instance, the first multi-capacitor structure 302 includes substantially the same structure as the first multi-capacitor structure 202 of FIGS. 2A and 2B; however, a bottom electrode 342 of the first multi-capacitor structure 302 is electrically connected to one or more transistors (e.g., transistors 312) through at least one sixth contact structure 358.

Additionally, the BEOL structures of the embodiment depicted in FIG. 3 may include or be electrically connected to additional structures. For instance, a third routing tier 352 including third routing structures 354 may be formed over the second routing tier 308. Fifth contact structures 356 may extend between and may contact some top electrodes 340 of first multi-capacitor structures 302 and some third routing structures 354. Seventh contact structures 359 may extend from some third routing structures 354 to fourth routing structures 360. The fourth routing structures 360 may be electrically connected to first routing structures 306 via eighth contact structures 362, and the first routing structures 306 may be electrically connected to base conductive routing structures 301 via first contact structures 314.

The third routing structures 354 may each be formed of and include conductive material. By way of non-limiting example, the third routing structures 354 may individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the third routing structures 354 are each formed of and include Al.

The fourth routing structures 360 may each be formed of and include conductive material. By way of non-limiting example, fourth routing structures 360 may individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the fourth routing structures 360 are each formed of and include Cu.

The sixth contact structures 358, the seventh contact structures 359, and the eighth contact structures 362 may each be formed of and include conductive material. By way of non-limiting example, the sixth contact structures 358, the seventh contact structures 359, and the eighth contact structures 362 may individually be formed of and include one or more of at least one metal, at least one alloy, and at least one conductive metal-containing material (e.g., a conductive metal nitride, a conductive metal silicide, a conductive metal carbide, a conductive metal oxide). In some embodiments, the sixth contact structures 358, the seventh contact structures 359, and the eighth contact structures 362 are each formed of and include W.

Referring still to FIG. 3, in some embodiments, the fourth routing structures 360 are formed within a respective routing tier other than the first, second, or third routing tiers 304, 308, 352 described above. Additionally, in one or more embodiments, the transistors 312 coupled to the first multi-capacitor structures 302 via the sixth contact structures 358 include CMOS circuitry transistors (e.g., pump circuitry transistors). The transistors 312 may include any of the transistors described above in regard to FIGS. 2A-2C.

FIG. 4 depicts a first multi-capacitor structure 402 according to one or more embodiments of the disclosure. For instance, the first multi-capacitor structure 402 is similar to the first multi-capacitor structure 302 of FIG. 3; however, each of the capacitors 438 (e.g., longer capacitors) extends a full vertical distance between the top plate portion 445 of the top electrode 440 and the bottom plate portion 447 of the bottom electrode 442 of the first multi-capacitor structure 402. Furthermore, the bottom electrode 442 may or may not be electrically connected to transistors.

FIG. 5 depicts a first multi-capacitor structure 502 according to one or more embodiments of the disclosure. For instance, the first multi-capacitor structure 502 includes substantially the same first multi-capacitor structure 402 of FIG. 4; however, first multi-capacitor structure 502 may have fewer capacitors 538, and the capacitors 538 may extend the full vertical distance between the top plate portion 545 of the top electrode 540 and the bottom plate portion 547 of the bottom electrode 542. Additionally, the bottom electrode 542 may be electrically connected to one or more transistors 512. Moreover, the first multi-capacitor structure 502 may have two groups of capacitors 538 with a first group 564 being electrically coupled to a first segment of the bottom plate portion 547 of the bottom electrode 542 and a second group 566 being electrically coupled to a second segment of the bottom plate portion 547 of the bottom electrode 542.

The first multi-capacitor structure 502 may include a first routing structure 506 with the first routing tier 504 and between the first group 564 of capacitors 538 and the second group 566 of capacitors 538 in the Y-direction. The first routing structure 506 may be electrically connected to transistors 512 through a ninth contact structure 568. The transistors 312 may include any of the transistors described above in regard to FIGS. 2A-2C.

Referring to FIGS. 2A-5 together, while specific configurations of the first multi-capacitor structures (e.g., first multi-capacitor structures 202, 302, 402, 502) are depicted and described, the disclosure is not so limited, and the first multi-capacitor structures may include additional or fewer capacitors and may include any combination of long capacitors and short capacitors described above. Additionally, the first multi-capacitor structures (e.g., first multi-capacitor structures 202, 302, 402, 502) of the disclosure may be advantageous. For example, the first multi-capacitor structures of the disclosure may be tailored to fit within spaces between control logic devices 236 (e.g., charge pumps) within the second microelectronic device structure 200 (e.g., a CMOS assembly) while supplying and regulating required voltages to the control logic devices 236. For instance, the effective surface areas of the first multi-capacitor structures may be tailored via one or more of a number of capacitors and lengths of capacitors to provide required voltages while meeting space requirements to fit within spaces between control logic devices 236 (e.g., charge pumps). Furthermore, one or more first multi-capacitor structures may be connected in series to provide relatively high voltages. For example, the first multi-capacitor structures may be tailored to provide between about 0.7 V and about 3.6 V. Moreover, as is discussed below, because the first multi-capacitor structures are able to supply required voltages to the control logic devices 236, capacitors within the memory devices (e.g., storage devices 114) can be used (e.g., exclusively used or exclusively dedicated) to operate access devices for MBIT and to manage and improve memory array efficiencies (e.g., data transfer rates).

Referring to FIGS. 2A-5, the second microelectronic device structure 200 (and, hence, the microelectronic device structure assembly 203) may include multiple first multi-capacitor structures and may include any combination of the first multi-capacitor structures 202, 302, 402, 502 described above in regard to FIGS. 2A-5.

Figure 6A:
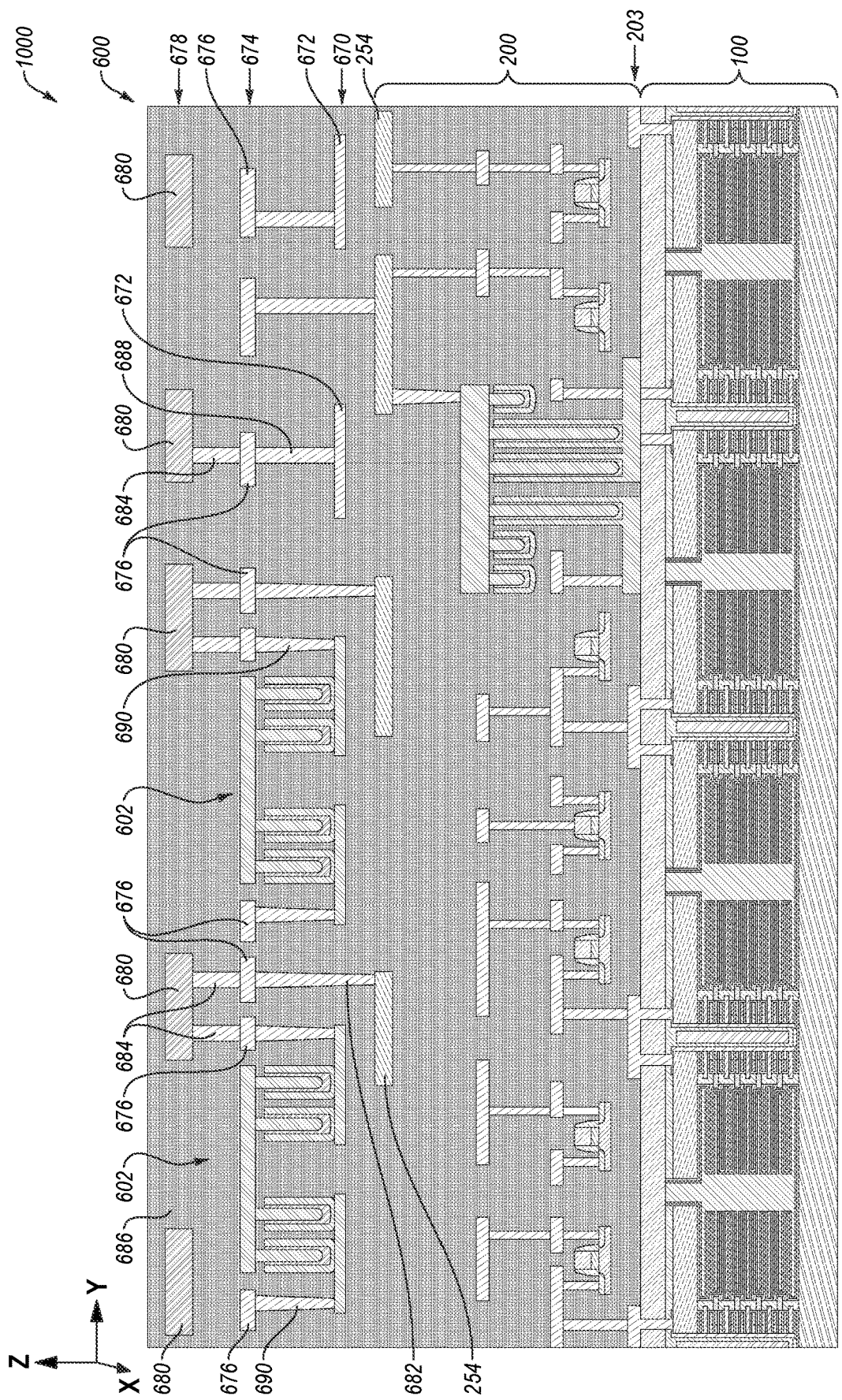
FIG. 6A shows simplified longitudinal cross-sectional view of an additional microelectronic device structure assembly including the microelectronic device structure assembly of FIG. 2A and a third microelectronic device structure, in accordance with embodiments of the disclosure.
Figure 6B:
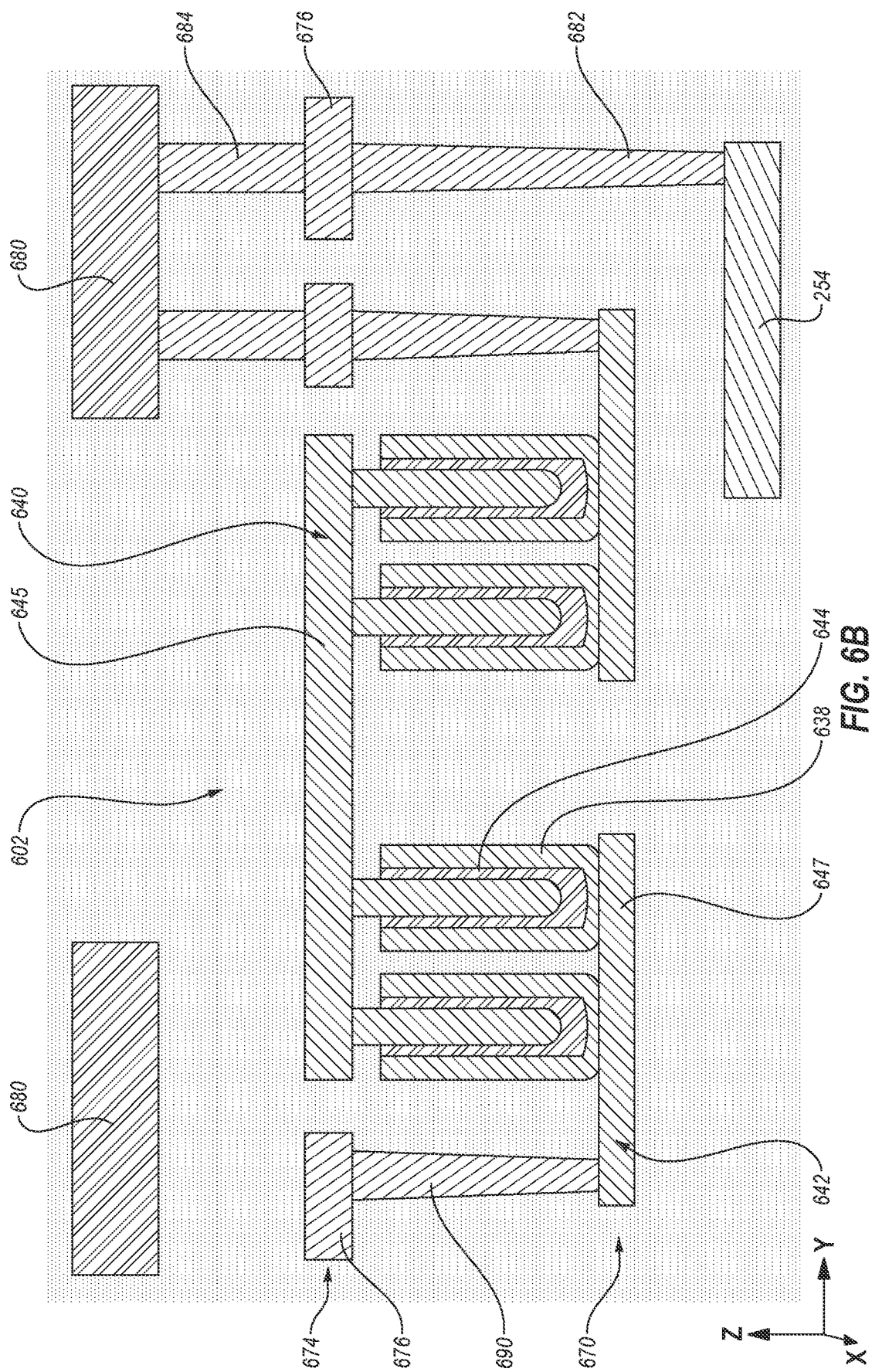
FIG. 6B shows a simplified longitudinal cross-sectional view of a multi-capacitor structure of the third microelectronic device structure, in accordance with additional embodiments of the disclosure.

FIG. 6A is a simplified longitudinal cross-sectional view of an additional microelectronic device structure assembly 1000 including a third microelectronic device structure 600 from the perspective of the X-direction (so as to depict a YZ-plane) provided (e.g., formed, attached) on or over the second microelectronic device structure 200 (and, hence, the microelectronic device structure assembly 203). FIG. 6B is a simplified, enlarged longitudinal cross-sectional view of a second multi-capacitor structure 602 of the third microelectronic device structure 600 from the perspective of the X-direction (so as to depict a YZ-plane) according to one or more embodiments of the disclosure.

As shown in FIG. 6A, the third microelectronic device structure 600 may be formed to include one or more second multi-capacitor structures 602, at least a fourth routing tier 670 including fifth routing structures 672, a fifth routing tier 674 including sixth routing structures 676, a sixth routing tier 678 with seventh routing structures 680, tenth contact structures 682 extending between the third routing structures 254 of the BEOL structures of the second microelectronic device structure 200 and the sixth routing structures 676 of the fifth routing tier 674, eleventh contact structures 684 extending between the sixth routing structures 676 of the fifth routing tier 674 and the seventh routing structures 680 of the sixth routing tier 678, twelfth contact structures 688 extending between the fifth routing structures 672 of the fourth routing tier 670 and the sixth routing structures 676 of the fifth routing tier 674, one or more second multi-capacitor structures 602, and at least one second isolation material 686. The second isolation material 686 may substantially cover and surround the fifth routing structures 672, the sixth routing structures 676, the seventh routing structures 680, the tenth contact structures 682, the eleventh contact structures 684, twelfth contact structures 688, and thirteenth contact structures 690.

In some embodiments, the second multi-capacitor structures 602 are formed amongst and between the routing structures and contact structures of the third microelectronic device structure 600 described above. Similar to the first multi-capacitor structures 202, 302, 402, 502 described above, the second multi-capacitor structures 602 may be utilized to regulate voltages supplied within the CMOS circuitry to control logic devices (e.g., control logic devices 236 (FIG. 2A)). For instance, the second multi-capacitor structures 602 may be utilized to supply and regulate voltages to any of the control logic devices described above. In some embodiments, the second multi-capacitor structures 602 are utilized in conjunction with the first multi-capacitor structures 202, 302, 402, 502 to supply and regulate voltages to one or more control logic devices (e.g., control logic devices 236 (FIG. 2A)).

The second multi-capacitor structures 602 may include capacitors 638 similar or substantially the same as the capacitors described above in regard to FIGS. 2-5. For example, the capacitors 638 may include MIM capacitors. In some embodiments, the capacitors 638 of the second multi-capacitor structures 602 may be shorter in vertical length (e.g., in the Z-direction) than the capacitors 238 of the first multi-capacitor structures 202, 302, 402, 502. Furthermore, in some embodiments, the second multi-capacitor structures 602 include a greater number of capacitors 638 relative to the first multi-capacitor structures 202, 302, 402, 502. In one or more embodiments, the capacitors 638 of the second multi-capacitor structures 602 are spaced apart by greater distances in the Y- and/or X-directions than the capacitors 238 of the first multi-capacitor structures 202, 302, 402, 502. As a result of the foregoing, the second multi-capacitor structures 602 may have a larger footprint in the XY-plane than the first multi-capacitor structures 202, 302, 402, 502.

Similar to the first multi-capacitor structures 202, 302, 402, 502, vertical lengths and a number of the capacitors 638 of the first multi-capacitor structure 202 may be selected to achieve a selected amount of effective surface area of the second multi-capacitor structures 602. As discussed above, selection of the amount of effective surface area of the second multi-capacitor structure 602 enables selection of a capacitance of the second multi-capacitor structure 602. The lengths and number of capacitors 638 of the second multi-capacitor structure 602 may be selected to provide a desired capacitance while satisfying given space requirements within the third microelectronic device structure 600. In some embodiments, the capacitance of the second multi-capacitor structure 602 is selected based on voltage requirements of control logic devices (e.g., charge pumps) to which the second multi-capacitor structure 602 supplies voltage. In some embodiments, vertical space (e.g., space within the Z-direction) within the third microelectronic device structure 600 may be more limited than vertical space within the second microelectronic device structure 200. As a result, to achieve the same or similar capacitance values as the first multi-capacitor structures 202, 302, 402, 502, the second multi-capacitor structure 602 may require additional capacitors relative to the first multi-capacitor structures 202, 302, 402, 502 and may require a larger footprint within the XY-plane relative to the first multi-capacitor structures 202, 302, 402, 502. As a result, the first multi-capacitor structures 202, 302, 402, 502 may be more appropriate for placement within the second microelectronic device structure 200 and between control logic devices 236 (FIG. 2A) of the second microelectronic device structure 200.

Similar to one or more of the first multi-capacitor structures 202, 302, 402, 502 described above, although some portions of the bottom electrode 642 are not shown as being connected to other portions of the bottom electrode 642 within the depicted YZ-plane, the differing portions of the bottom electrode 642 may be connected to each other in regions of the third microelectronic device structure 600 extending into or out of the page (e.g., in the X-direction) according to the view depicted in FIGS. 6A and 6B. For example, in some embodiments, the bottom plate portion 647 of the bottom electrode 642 is segmented in the Y-direction within the YZ-plane. For example, the bottom plate portion 647 may have a first segment and a second segment. Moreover, the first segment and the second segment of the bottom plate portion 647 may be connected to each other within regions of the third microelectronic device structure 600 extending into or out of the page (e.g., in the X-direction) according to the view depicted in FIGS. 6A and 6B.

In some embodiments, a top plate portion 645 of the top electrode 640 of the second multi-capacitor structure 602 may be vertically aligned with the fifth routing tier 674 of the third microelectronic device structure 600. In some embodiments, the top plate portion 645 of the top electrode 640 comprises a portion of the sixth routing structures 676 of the fifth routing tier 674. Put another way, the top plate portion 645 of the top electrode 640 may be part of the fifth routing tier 674, may be formed during the formation of the sixth routing structures 676, and may have substantially the same material composition as the sixth routing structures 676. Additionally, the bottom plate portion 647 of the bottom electrode 642 of the second multi-capacitor structure 602 may be at least partially (e.g., substantially) vertically aligned with the fourth routing tier 670. In some embodiments, the bottom plate portion 647 of the bottom electrode 642 comprises a portion of the fifth routing structures 672. Put another way, the bottom plate portion 647 of the bottom electrode 642 may be part of the routing tier including the fifth routing structures 672, may be formed during the formation of the fifth routing structures 672, and may have substantially the same material composition as the fifth routing structures 672. In one or more embodiments, the second multi-capacitor structure 602 include thirteenth contact structures 690 contacting the bottom electrode 642 of the second multi-capacitor structure 602 and extending to sixth routing structures 676 of the fifth routing tier 674.

The capacitor dielectric 644 and top and bottom electrodes 640, 642 may include any of the materials described above in regard to the first multi-capacitor structures 202, 302, 402, 502. The fifth routing structures 672, the sixth routing structures 676, the seventh routing structures 680, the tenth contact structures 682, the eleventh contact structures 684, twelfth contact structures 688, and thirteenth contact structures 690 may include any of the materials described above in regard to the routing structures and contact structures of the first multi-capacitor structures 202, 302, 402, 502. As a non-limiting example, the fifth routing structures 672, the sixth routing structures 676, the tenth contact structures 682, the eleventh contact structures 684, twelfth contact structures 688, and thirteenth contact structures 690 may include tungsten (W), and the seventh routing structures 680 may include aluminum (Al). At least some of the fifth routing structures 672, the sixth routing structures 676, the seventh routing structures 680, the tenth contact structures 682, the eleventh contact structures 684, twelfth contact structures 688, and thirteenth contact structures 690 may be employed as local routing structures of a microelectronic device (e.g., a memory device, such as a DRAM device) of the disclosure.

As noted above, the second isolation material 686 may be formed on or over portions of the fifth routing structures 672, the sixth routing structures 676, the seventh routing structures 680, the tenth contact structures 682, the eleventh contact structures 684, twelfth contact structures 688, and thirteenth contact structures 690. In some embodiments, the second isolation material 686 is formed of and includes a dielectric oxide material, such as $SiO_x$ (e.g., $SiO_2$). The second isolation material 686 may be substantially homogeneous, or the second isolation material 686 may be heterogeneous. The second isolation material 686 may, for example, be formed of and include a stack of at least two different dielectric materials.

In some embodiments, the third microelectronic device structure 600 is formed on or over the second microelectronic device structure 200 of the microelectronic device structure assembly 203 to form the additional microelectronic device structure assembly 1000. For example, features (e.g., structures, materials, devices, regions) of the third microelectronic device structure 600 may be formed on or over an upper boundary of the second microelectronic device structure 200 using conventional process (e.g., conventional material deposition processes, conventional material removal processes, conventional photolithographic patterning processes), such as conventional silicon-on-insulator (SOI) formation processes. In additional embodiments, the third microelectronic device structure 600 is formed separate from the microelectronic device structure assembly 203, and is then attached (e.g., bonded) to second microelectronic device structure 200 of the additional microelectronic device structure assembly 1000. For example, the third microelectronic device structure 600 may be formed separate from the microelectronic device structure assembly 203, and then the third microelectronic device structure 600 may be bonded to microelectronic device structure assembly 203 by way of one or more of dielectric-dielectric bonding (e.g., oxide-oxide bonding) and metal-metal bonding. In some embodiments, the third microelectronic device structure 600 may be formed separate from the microelectronic device structure assembly 203 and formed separate from one another, and then the second isolation material 686 of the third microelectronic device structure 600 is bonded (e.g., oxide-oxide bonded) to the first isolation material 218 of the second microelectronic device structure 200 to form the additional microelectronic device structure assembly 1000.

Figure 7:
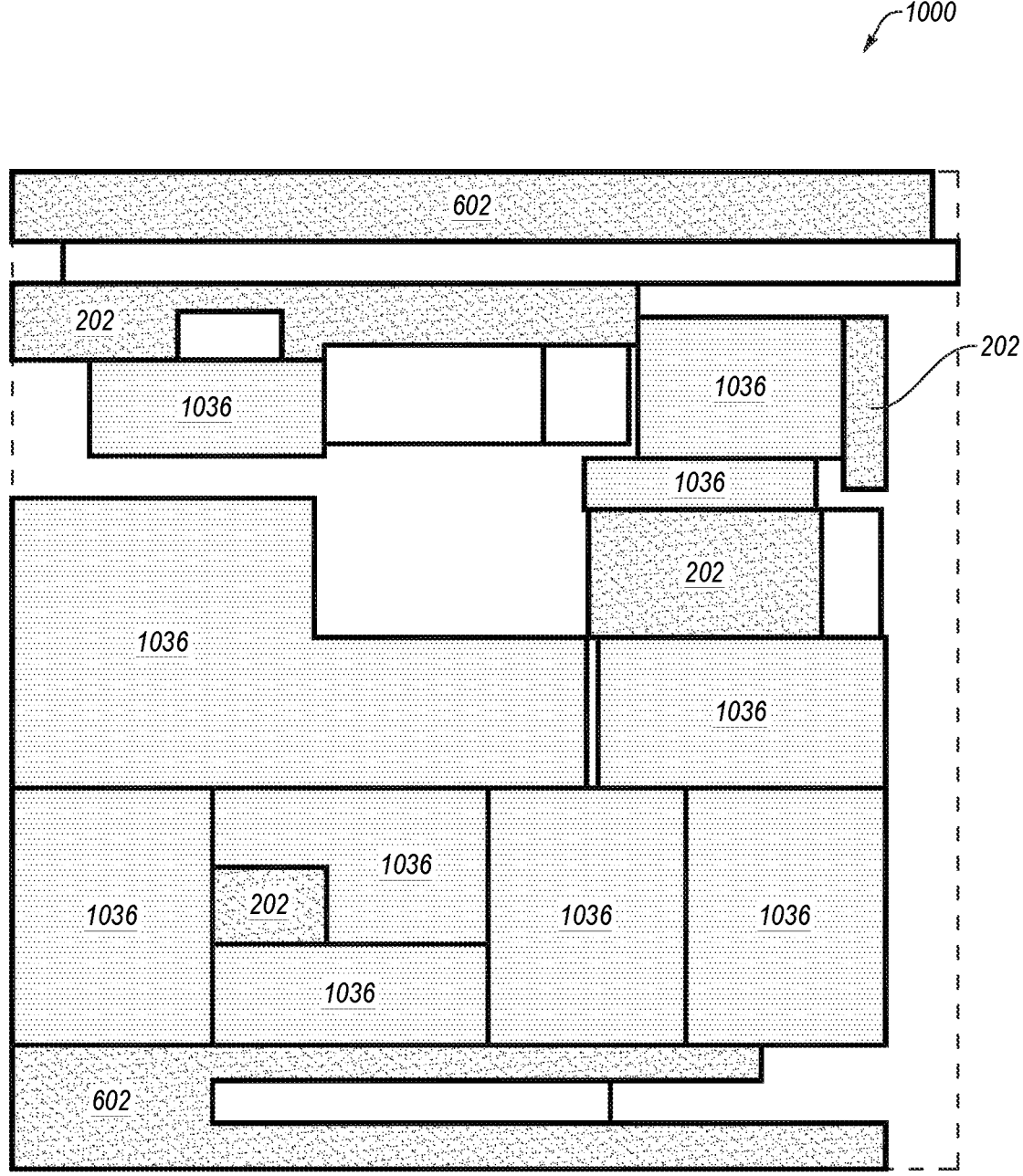
FIG. 7 shows a top schematic view of a microelectronic device structure assembly implementing one or more of first multi-capacitor structures and one or more of second multi-capacitor structures, in accordance with embodiments of the disclosure.

FIG. 7 shows a top schematic view of the additional microelectronic device structure assembly 1000 implementing one or more of the first multi-capacitor structures (e.g., first multi-capacitor structures 202, 302, 402, 502) (referred to in FIG. 7 collectively with reference numeral "202" for clarity) and one or more of the second multi-capacitor structures 602 described above. The view of FIG. 7 depicts a layout of multi-capacitor structures (e.g., first multi-capacitor structures and/or second multi-capacitor structures) relative to control logic devices (e.g., control logic devices 236 (FIG. 2A)) as if extending through the page of the view depicted in FIG. 7; however, it is understood from the description above that the multi-capacitor structures may be within a second microelectronic device structure 200 (e.g., a CMOS device structure) above (e.g., vertically neighboring) a memory array (e.g., a first microelectronic device structure 100) and/or above (e.g., vertically neighboring) CMOS copper metallization (e.g., above BEOL structures of the CMOS device structure and within the third microelectronic device structure 600 (FIG. 6A)).

As shown in FIG. 7, in some embodiments, the first multi-capacitor structures 202 are formed in relatively small spaces between control logic devices 1036 (e.g., CMOS devices) and circuitry. As a result, the first multi-capacitor structures 202 may be formed between any of the control logic devices (e.g., pumps) described above in regard FIGS. 2A-2C. Forming the first multi-capacitor structures 202 between the control logic devices 1036 (e.g., pumps) of the CMOS circuitry may enable the first multi-capacitor structures 202 to access and/or supply voltages to portions of the microelectronic device structure assembly 1000 not otherwise accessible. Furthermore, forming the first multi-capacitor structures 202 between the control logic devices (e.g., pumps) of the CMOS circuitry may enable to first multi-capacitor structures 202 to better interface and operate elements of the first microelectronic device structure 100 (e.g., memory array). Referring still to FIG. 7, the second multi-capacitor structures 602 may be formed above CMOS copper metallization (e.g., above BEOL structures of the CMOS device structure and within the third microelectronic device structure 600 (FIG. 6A)).

Referring to FIGS. 1A-7 together, the multi-capacitor structures (e.g., the first and second multi-capacitor structures) and the placement of the multi-capacitor structures within the microelectronic device structure assembly 1000 of the disclosure provide advantages over conventional capacitor structures and manners for supplying and regulating voltage to control logic devices. For example, the multi-capacitor structures of the disclosure may enable the multi-capacitor structures to be formed within relatively small areas between control logic devices (e.g., pumps) of the CMOS circuitry and vertically adjacent to a memory device (e.g., memory array). As a result, the multi-capacitor structures of the disclosure may be relatively easily integrated with memory devices (e.g., 3D DRAM memory device, DRAM memory device, an HRAM memory device, a 2D memory array, an MTX memory device) while requiring relatively low costs and providing a lower delay time option in comparison to conventional capacitors placement. Moreover, due to the multi-capacitor structures within the microelectronic device structure assembly 1000 and outside of a memory device of the microelectronic device structure assembly 1000, capacitors within the memory devices (e.g., storage devices 114) can be used (e.g., exclusively used and/or exclusively dedicated) to operate access devices for MBIT and to manage and improve memory array efficiencies (e.g., data transfer rates). Furthermore, in comparison to conventional flat MIM capacitors, the multi-capacitor structures of the disclosure require about forty-five times less space within the XY-plane while providing a same amount of capacitance. Moreover, in comparison to conventional capacitor structures utilized to supply and regulate voltages to memory devices having lower power requirements (e.g., 2D DRAM), the multi-capacitor structures of the disclosure may supply sufficient voltages to support both high-power and low-power 3D memory devices.

Thus, in accordance with some embodiments of the disclosure, a microelectronic device comprises a first microelectronic device structure comprising a memory array region comprising memory cells and a second microelectronic device structure vertically overlying the first microelectronic device structure. The second microelectronic device structure comprises control logic devices configured to effectuate at least a portion of control operations for the memory cells and first multi-capacitor structures within spaces between the control logic devices and horizontally neighboring at least one of the control logic devices. The first multi-capacitor structures span a same or fewer number of routing tiers as the control logic devices and are configured to regulate and supply voltage to one or more of the control logic devices.

Furthermore, in accordance with additional embodiments of the disclosure, a microelectronic device comprises vertical stacks of memory cells, voltage pumps vertically overlying the vertical stacks of memory cells, first multi-capacitor structures vertically overlying the vertical stacks of memory cells and positioned horizontally between the voltage pumps. The first multi-capacitor structures are electrically connected to the voltage pumps and configured to regulate and supply voltage to the voltage pumps. The microelectronic device further comprises second multi-capacitor structures vertically overlying the first multi-capacitor structures and the voltage pumps.

Thus, in accordance with yet other embodiments of the disclosure, a method of forming a microelectronic device comprises forming a first microelectronic device structure comprising a memory array region comprising memory cells and forming a second microelectronic device structure. The second microelectronic device structure comprises control logic devices configured to effectuate at least a portion of control operations for the memory cells and first multi-capacitor structures horizontally between and at least partially vertically overlapping the control logic devices. The method further comprises attaching the second microelectronic device structure to the first microelectronic device structure such that the control logic devices and the first multi-capacitor structures vertically overlie the memory cells.

Figure 8:
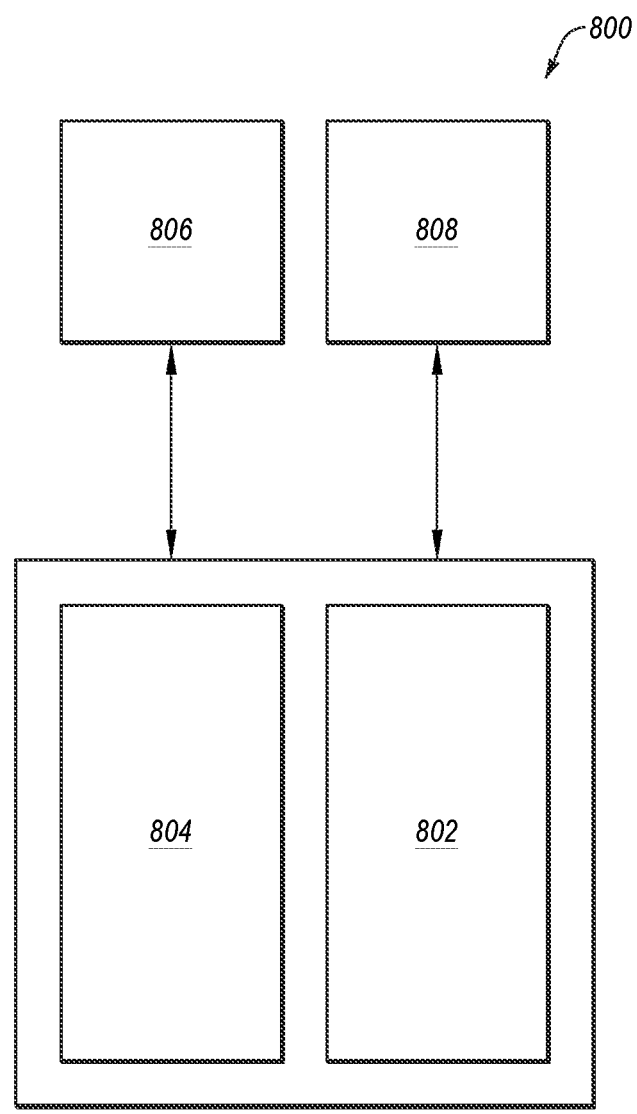
FIG. 8 shows a schematic block diagram of an electronic system, in accordance with an embodiment of the disclosure.

Structures, assemblies, and devices in accordance with embodiments of the disclosure may be used in embodiments of electronic systems of the disclosure. For example, FIG. 8 is a block diagram of an illustrative electronic system 800 according to embodiments of the disclosure. The electronic system 800 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 800 includes at least one memory device 802. The memory device 802 may comprise, for example, an embodiment of one or more of a microelectronic device structure, a microelectronic device structure assembly, a relatively larger microelectronic device structure assembly, and a microelectronic device previously described herein with reference to FIGS. 1A-7. The electronic system 800 may further include at least one electronic signal processor device 804 (often referred to as a "microprocessor"). The electronic signal processor device 804 may, optionally, include an embodiment of one or more of a microelectronic device structure, a microelectronic device structure assembly, a relatively larger microelectronic device structure assembly, and a microelectronic device previously described herein with reference to FIGS. 1A-7. While the memory device 802 and the electronic signal processor device 804 are depicted as two (2) separate devices in FIG. 8, in additional embodiments, a single (e.g., only one) memory/processor device having the functionalities of the memory device 802 and the electronic signal processor device 804 is included in the electronic system 800. In such embodiments, the memory/processor device may include one or more of a microelectronic device structure, a microelectronic device structure assembly, a relatively larger microelectronic device structure assembly, and a microelectronic device previously described herein with reference to FIGS. 1A-7. The electronic system 800 may further include one or more input devices 806 for inputting information into the electronic system 800 by a user, such as, for example, a mouse or other pointing device, a keyboard, a touchpad, a button, or a control panel. The electronic system 800 may further include one or more output devices 808 for outputting information (e.g., visual or audio output) to a user such as, for example, one or more of a monitor, a display, a printer, an audio output jack, and a speaker. In some embodiments, the input device 806 and the output device 808 may comprise a single touchscreen device that can be used both to input information to the electronic system 800 and to output visual information to a user. The input device 806 and the output device 808 may communicate electrically with one or more of the memory device 802 and the electronic signal processor device 804.

Thus, in accordance with embodiments of the disclosure, an electronic system comprises an input device, an output device, a processor device operably coupled to the input device and the output device, and a memory device operably coupled to the processor device. The memory device comprises a memory array region comprising vertical stacks of memory cells, control logic devices vertically overlying within a horizontal area of the memory array region, the control logic devices electrically connected to and configured to control operations for the vertical stacks of memory cells, first multi-capacitor structures vertically overlying within a horizontal area of the memory array region, the first multi-capacitor structures horizontally interposed between and at least partially vertically overlapping the control logic devices; and second multi-capacitor structures vertically overlying the first multi-capacitor structures and coupled to conductive routing structures in electrically communication with the to the control logic devices and the first multi-capacitor structures.

The methods, structures, assemblies, devices, and systems of the disclosure advantageously facilitate one or more of improved performance, reliability, durability, increased miniaturization of components, improved pattern quality, and greater packaging density as compared to conventional methods, conventional structures, conventional assemblies, conventional devices, and conventional systems. The methods, structures, and assemblies of the disclosure may substantially alleviate problems related to the formation and processing of conventional microelectronic devices, such as undesirable feature damage (e.g., corrosion damage), deformations (e.g., warping, bowing, dishing, bending), and performance limitations (e.g., speed limitations, data transfer limitations, power consumption limitations).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
a first microelectronic device structure comprising a memory array region comprising memory cells; and
a second microelectronic device structure vertically overlying the first microelectronic device structure, the second microelectronic device structure comprising:
control logic devices configured to effectuate at least a portion of control operations for the memory cells; and
first multi-capacitor structures within spaces between the control logic devices and horizontally neighboring at least one of the control logic devices, the first multi-capacitor structures spanning a same or fewer number of routing tiers as the control logic devices and configured to regulate and supply voltage to one or more of the control logic devices; and
a third microelectronic device structure vertically overlying the second microelectronic device structure, the third microelectronic device structure comprising second multi-capacitor structures.

2. The microelectronic device of claim 1, wherein the control logic devices comprise one or more of voltage pumps, delay-locked loop (DLL) circuitry, drain supply voltage ($V_{dd}$) regulators, chip/deck control circuitry, block switches, select devices, decoders, repair circuitry, memory test devices, array multiplexers (MUX), error checking and correction (ECC) devices, self-refresh/wear leveling devices, page buffers, data paths, or I/O devices.

3. The microelectronic device of claim 1, wherein the control logic devices comprise:
two or more routing tiers, each tier having respective routing structures; and
contact structures extending between and contacting at least some of the respective routing structures of the two or more routing tiers.

4. The microelectronic device of claim 3, wherein the memory array region comprises vertical stacks of dynamic random-access memory (DRAM) cells.

5. The microelectronic device of claim 1, wherein each of the first multi-capacitor structures comprises a metal-insulator-metal (MIM) capacitor.

6. The microelectronic device of claim 1, wherein memory array region comprises:
a stack structure comprising:
levels of conductive structures vertically alternating with levels of insulative structures; and
staircase structures at lateral ends of the stack structure; and
vertical stacks of memory cells, at least one of the vertical stacks of memory cells comprising:
stacked capacitor structures, each stacked capacitor structure comprising capacitor structures vertically spaced from each other by at least a level of the levels of insulative structures;
transistor structures, each transistor structure operably coupled to a capacitor structure and to a conductive structure of the levels of conductive structures; and
a conductive pillar structure vertically extending through the transistor structures; and
conductive contact structures in electrical communication with the levels of conductive structures at steps of the staircase structures.

7. The microelectronic device of claim 1, wherein memory array region comprises one of dynamic random-access memory (DRAM) cells, holographic random-access memory (HRAM) cells, and cross-point memory (MTX) cells.

8. The microelectronic device of claim 1, further comprising a back end of the line (BEOL) structure over a side of the second microelectronic device structure opposite the first microelectronic device structure.

9. The microelectronic device of claim 1, wherein the first multi-capacitor structures and the second multi-capacitor structures comprise metal-insulator-metal (MIM) capacitors.

* * * * *